United States Patent
Bianucci et al.

(10) Patent No.: US 8,746,975 B2
(45) Date of Patent: *Jun. 10, 2014

(54) THERMAL MANAGEMENT SYSTEMS, ASSEMBLIES AND METHODS FOR GRAZING INCIDENCE COLLECTORS FOR EUV LITHOGRAPHY

(75) Inventors: Giovanni Bianucci, Vimercate (IT); Fabio Zocchi, Samarate (IT); Robert Banham, Woodbridge (GB); Marco Pedrali, Bergamo (IT); Boris Grek, Hayward, CA (US); Natale Ceglio, Pleasanton, CA (US); Dean Shough, Newark, CA (US); Gordon Yue, Sunnyvale, CA (US); Daniel Stearns, Los Altos, CA (US); Richard A. Levesque, Livermore, CA (US); Giuseppe Valsecchi, Oggiono Lecco (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 218 days.

This patent is subject to a terminal disclaimer.

(21) Appl. No.: 13/355,725

(22) Filed: Jan. 23, 2012

(65) Prior Publication Data
US 2012/0212719 A1  Aug. 23, 2012

Related U.S. Application Data

(60) Provisional application No. 61/463,461, filed on Feb. 17, 2011.

(51) Int. Cl.
*H01J 35/02* (2006.01)
*H01J 35/16* (2006.01)
*G21K 1/06* (2006.01)

(52) U.S. Cl.
USPC .............. 378/200; 378/85; 378/141; 378/199

(58) Field of Classification Search
USPC .............. 378/70, 82, 85, 141, 199, 200, 204, 378/210; 359/838, 845, 850, 851, 871, 883
See application file for complete search history.

(56) References Cited

U.S. PATENT DOCUMENTS

| 2,350,348 A | 6/1944 | Gaugler |
| 4,765,396 A | 8/1988 | Seidenberg |

(Continued)

FOREIGN PATENT DOCUMENTS

| EP | 1 406 124 A1 | 4/2004 |
| WO | WO 2004/042828 A2 | 5/2004 |

OTHER PUBLICATIONS

Jansson, "Heat Pipes" QEX, Jul./Aug. 2010, pp. 3-9.

(Continued)

*Primary Examiner* — Anastasia Midkiff
(74) *Attorney, Agent, or Firm* — Opticus IP Law PLLC

(57) ABSTRACT

Systems, assemblies and methods for thermally managing a grazing incidence collector (GIC) for EUV lithography applications are disclosed. The GIC thermal management assembly includes a GIC mirror shell interfaced with a jacket to form a sealed chamber. An open cell, heat transfer (OCHT) material is disposed within the metal chamber and is thermally and mechanically bonded with the GIC mirror shell and jacket. A coolant is flowed in an azimuthally symmetric fashion through the OCHT material between input and output plenums to effectuate cooling when the GIC thermal management assembly is used in a GIC mirror system configured to receive and form collected EUV radiation from an EUV radiation source.

26 Claims, 18 Drawing Sheets

(56) References Cited

U.S. PATENT DOCUMENTS

| | | |
|---|---|---|
| 6,196,307 B1 | 3/2001 | Ozmat |
| 6,206,531 B1 * | 3/2001 | Williams et al. ............. 359/883 |
| 6,706,239 B2 | 3/2004 | Haack et al. |
| 6,831,744 B2 * | 12/2004 | Masaki et al. ................ 356/400 |
| 6,859,259 B2 | 2/2005 | Bakker et al. |
| 7,002,168 B2 | 2/2006 | Jacob et al. |
| 7,164,144 B2 | 1/2007 | Partlo et al. |
| 7,212,274 B2 | 5/2007 | Hara et al |
| 7,292,307 B2 * | 11/2007 | Kino ............................... 355/30 |
| 7,401,643 B2 | 7/2008 | Queheillalt et al. |
| 7,457,126 B2 | 11/2008 | Ahrens |
| 7,513,651 B2 | 4/2009 | Chen |
| 7,645,056 B1 | 1/2010 | Mills et al. |
| 7,938,543 B2 | 5/2011 | Gerets et al. |
| 8,012,598 B2 | 9/2011 | Naumann et al. |
| 8,047,686 B2 | 11/2011 | Dahm et al. |
| 8,061,032 B2 | 11/2011 | Banham et al. |
| 8,069,912 B2 | 12/2011 | Campagna et al. |
| 8,153,994 B2 | 4/2012 | Ghislanzoni et al. |
| 8,171,986 B2 | 5/2012 | Klein |
| 8,272,431 B2 | 9/2012 | Campagna et al. |
| 8,330,131 B2 | 12/2012 | Ceglio et al. |
| 8,371,700 B2 | 2/2013 | Lin et al. |
| 8,390,785 B2 | 3/2013 | Zocchi et al. |
| 8,529,105 B2 | 9/2013 | Calon et al. |
| 8,540,497 B2 | 9/2013 | Chang |
| 8,542,344 B2 | 9/2013 | Hoogendam et al. |
| 8,550,150 B2 | 10/2013 | Hou |
| 8,550,650 B1 | 10/2013 | McGinty |
| 8,569,939 B2 | 10/2013 | Kim et al. |
| 8,594,277 B2 | 11/2013 | Zocchi et al. |
| 8,596,073 B2 | 12/2013 | Zhang |
| 2004/0051984 A1 * | 3/2004 | Oshino et al. ................. 359/845 |
| 2006/0093253 A1 | 5/2006 | Egle et al. |
| 2006/0131515 A1 | 6/2006 | Partlo et al. |
| 2006/0137862 A1 | 6/2006 | Huang et al. |
| 2006/0196651 A1 | 9/2006 | Board et al. |
| 2007/0084461 A1 | 4/2007 | Box et al. |
| 2007/0228113 A1 | 10/2007 | Dupree et al. |
| 2008/0018876 A1 | 1/2008 | Stuetzle et al. |
| 2008/0117637 A1 | 5/2008 | Chang et al. |
| 2009/0153975 A1 | 6/2009 | O'Reilly et al. |
| 2009/0224182 A1 | 9/2009 | McGeoch |
| 2010/0096557 A1 | 4/2010 | Zocchi et al. |
| 2010/0296308 A1 | 11/2010 | Ohsawa |
| 2011/0075118 A1 | 3/2011 | Jacobs et al. |
| 2011/0199771 A1 | 8/2011 | Luu |
| 2011/0232878 A1 | 9/2011 | Jacobs et al. |
| 2012/0147349 A1 | 6/2012 | van Dijsseldonk |
| 2012/0199331 A1 | 8/2012 | Maurer et al. |
| 2012/0199335 A1 | 8/2012 | Maurer |
| 2012/0210581 A1 | 8/2012 | Wallaert et al. |
| 2012/0227929 A1 | 9/2012 | Rose et al. |
| 2013/0228313 A1 | 9/2013 | Fried |
| 2013/0269913 A1 | 10/2013 | Ueda et al. |

OTHER PUBLICATIONS

Bianucci et al., "Design and fabrication considerations of EUVL collectors for HVM" Proc. SPIE. 7271, Alternative Lithographic Technologies, 72710C (2009).

Bianucci et al., "Development and performance of grazing and normal incidence collectors for the HVM DPP and LPP sources" Proc. SPIE 7636, Extreme Ultraviolet (EUV) Lithography, 76360C (2010).

Bianucci et al., "Enabling the 22 nm node via grazing incidence collectors integrated into the DPP source for EUVL HVM" Proc. SPIE 7969, 79690B (2011).

Bianucci et al., "Low CoO grazing incidence collectors for EUVL HVM" Proc. SPIE 8322, Extreme Ultraviolet (EUV) Lithography III, 832216 (2012).

* cited by examiner

THERMAL MANAGEMENT SYSTEMS, ASSEMBLIES AND METHODS FOR GRAZING INCIDENCE COLLECTORS FOR EUV LITHOGRAPHY

CLAIM OF PRIORITY

This application claims priority from U.S. Provisional Patent Application Ser. No. 61/463,461, filed on Feb. 17, 2011.

FIELD

The present invention relates generally to grazing incidence collectors (GICs), and in particular to cooling systems and methods for GICs used in extreme ultraviolet (EUV) lithography.

BACKGROUND ART

EUV lithography is anticipated to be the lithographic process of choice for producing future generations of semiconductor devices having linewidths on the order of 32 nm and smaller. The wavelength of the EUV radiation is nominally 13.5 nm, which calls for the use of specialized optics to collect and image the EUV radiation.

One type of EUV optical system used to collect the radiation from the light source is a grazing incidence collector (GIC). A GIC typically comprises one or more concentrically-arranged GIC mirror shells configured to receive radiation from the EUV source at grazing incidence and reflect the radiation to collect the radiation at an intermediate focus, such that the downstream radiation pattern in the far field is uniform to within a specification set by the overall system optical design.

The radiation sources being considered for EUV lithography include a discharge-produced plasma (DPP) and laser-produced plasma (LPP). The conversion efficiency of these sources is only a few percent so that most of the energy used to generate the EUV radiation is converted to infrared, visible, UV radiation and energetic particles that can be incident upon the one or more GIC mirror shells. This radiation causes a substantial thermal load on the one or more GIC mirror shells.

Consequently, each GIC mirror shell therefore needs to be thermally managed so that the heat absorbed by the GIC mirror does not substantially adversely affect GIC performance or damage the GIC. In particular, the thermal management needs to be carried out under high power loading conditions while preventing optical distortion of the one or more GIC mirror shells. This is because the uniformity and stability of the illumination of the reflective reticle is a key aspect of quality control in EUV lithography. In particular, the intensity and angular distributions of the EUV radiation delivered by the GIC to the input aperture of the illuminator must not change significantly as the thermal load on the GIC is cycled. This requires a high degree of stability of the radiation pattern formed in the far field, and this stability can be compromised by distortion or figure errors (and especially time-varying distortion and figure errors) in the GIC mirror shells.

To date, essentially all GICs for EUV lithography have been used primarily in the laboratory or for developmental "alpha" systems under very controlled conditions of limited thermal loading. As such, there has been little effort directed to GIC thermal management architectures appropriate for GICs' use in commercially viable, high power EUV lithography systems. Since the increasing demand for higher EUV power also increases the thermal load on the GIC, more efficient and effective thermal management systems must be implemented for GICs for use in EUV lithography systems to minimize the optical distortion and other adverse effects on the GIC caused by large thermal loads.

SUMMARY

The GIC thermal managements systems, assemblies and methods disclosed herein provide important advantages over prior art GIC cooling systems. The use of an open-cell heat transfer (OCHT) material within a chamber immediately adjacent substantially the entire GIC mirror shell outer surface, combined with the substantially isotropic flow of a coolant through OCHT material, results in substantially uniform cooling of the GIC mirror shell over the entire GIC mirror shell. This is a result of the transfer of significant amounts of heat from the GIC mirror shell through the OCHT material to the coolant. This architecture avoids spatial modulations of the GIC mirror shell that can occur when using networks of cooling lines in thermal contact with the GIC mirror shell, and it enables GIC mirror thermal stability even at very high power loading onto the collector.

Moreover, the GIC thermal management assemblies disclosed herein enable high coolant flow rates while adding only a few millimeters of width to the GIC mirror shell. This results in a low profile design that allows for a nested GIC mirror shell configuration without obscuring the optical pathways between the EUV radiation source and the intermediate focus.

The OCHT material has a large effective surface area for cooling that provides a relative large convective cooling capacity. The inherent high heat transfer coefficient of the OCHT material, coupled with the relatively high coolant flow rate, provide an efficient mechanism for removing up to (and if necessary more than) 10 kW per shell of absorbed power, while limiting the temperature increase of the GIC mirror shell.

An aspect of the thermal management system includes four main features. The first is a jacketed chamber configured to allow for "global" coolant flow over the back surface of the GIC mirror shell. The second is the OCHT material adjacent the back surface of the GIC mirror shell that serves to amplify the cooling effect as compared to flowing the coolant without the OCHT material. The third is a plenum system designed to supply sufficient coolant in an azimuthally symmetric way from input end to output end without obstructing working radiation from the EUV source. The fourth is a shield to protect the leading edge from heat and erosion.

An aspect of the disclosure is a grazing incidence collector (GIC) thermal management assembly that employs the flow of a coolant. The GIC thermal management assembly includes a GIC mirror shell, a jacket and an open-cell, heat transfer (OCHT) material. The GIC mirror shell has a reflective inner surface, an opposite outer surface, and first and second mirror ends; The jacket has an inner surface and first and second jacket ends. The jacket and GIC mirror shell has first and second interfaces at the respective first and second mirror and jacket ends to define fluidly sealed chamber between the inner surface of the jacket and outer surface of the GIC mirror shell. The sealed chamber has input and output ends that define respective input and output plenums having respective input and output apertures. The open-cell, heat transfer (OCHT) material is contained with the sealed chamber. The OCHT material is thermally connected to the outer surface of the GIC mirror shell and the inner surface of the jacket. The OCHT material serves to support the flow of the coolant therethrough from the input plenum to the output plenum.

In the GIC thermal management assembly, the OCHT material is preferably mechanically connected to the GIC mirror shell and the jacket.

In the GIC thermal management assembly, the coolant is preferably one of a liquid and a gas.

In the GIC thermal management assembly, at least one of the first and second interfaces preferably comprises a compliant feature.

In the GIC thermal management assembly, the compliant feature is preferably configured to be compliant when subject to forces associated with assembling the GIC thermal management assembly but substantially non-compliant when subjected to hydrostatic forces associated with said flow of coolant through the chamber and the OCHT material.

In the GIC thermal management assembly, the compliant feature is preferably formed from the same material as the jacket.

In the GIC thermal management assembly, the compliant feature preferably comprises an epoxy.

In the GIC thermal management assembly, the compliant feature preferably includes a plurality of grooves formed in the jacket at one or both jacket ends.

In the GIC thermal management assembly, the jacket and the GIC mirror shell are preferably either welded together or epoxied together.

In the GIC thermal management assembly, the OCHT material preferably comprises as least one of: a metal foam, one or more springs, and a metal mesh.

In the GIC thermal management assembly, the OCHT material preferably comprises metal foam having a pore density of between 20 pores per inch (PPI) and 100 PPI.

In the GIC thermal management assembly, the OCHT material preferably comprises metal foam, and the metal foam comprises at least one of Al, C, SiC, Cu and Ni.

In the GIC thermal management assembly, the interfaced jacket and GIC mirror shell preferably has a width at respective leading and trailing edges of between 3 mm and 10 mm.

In the GIC thermal management assembly, the OCHT material is preferably thermally contacted to the inner surface of the jacket with intermediate contact layers.

In the GIC thermal management assembly, the intermediate contact layers preferably provide a mechanical bond between the OCHT material, the GIC mirror shell and the jacket.

In the GIC thermal management assembly, the interfaced jacket and GIC mirror shell preferably defines a GIC cooling structure having a leading end and a trailing end. The leading end includes a shield.

In the GIC thermal management assembly, the shield preferably comprises a cooled ring.

In the GIC thermal management assembly, the shield preferably includes an inner surface adjacent the leading end and an opposite outer surface. The shield preferably further comprises either tungsten or a molybdenum layer.

The GIC thermal management assembly preferably further comprises input and output coolant lines fluidly respectively attached to the input and output plenums.

Another aspect of the disclosure is a thermally managed GIC mirror system. The thermally managed GIC mirror system includes the above-mentioned GIC thermal management assembly and a coolant supply unit. The coolant supply unit is fluidly connected to the input and output coolant lines. The coolant supply unit is configured to provide the fluid of the coolant under pressure to the input plenum via the input coolant line and receive the fluid of the coolant from the output plenum via the output coolant line.

The thermally managed GIC mirror system preferably further includes the input and output plenums being configured to provide coolant to and receive coolant from the OCHT material in an azimuthally symmetric manner.

The thermally managed GIC mirror system preferably further includes the system having a pressure drop along the azimuthal direction of the input and output plenums of less than 2 bar.

In the thermally managed GIC mirror system, the coolant preferably has a flow rate between the input and output plenums of between 5 liters per minute and 60 liters per minute.

The thermally managed GIC mirror system preferably further includes multiple GIC thermal management assemblies fluidly connected to the coolant supply unit. The GIC mirror shells are preferably configured in a nested configuration.

Another aspect of the disclosure is an extreme ultraviolet (EUV) lithography system for illuminating a reflective reticle. The EUV lithography system includes a source of EUV radiation, the above-mentioned thermally managed GIC mirror system and an illuminator. The thermally managed GIC mirror system is configured to receive the EUV radiation and form collected EUV radiation. The illuminator is configured to receive the collected EUV radiation and form condensed EUV radiation for illuminating the reflective reticle.

The EUV lithography system is preferably for forming a patterned image on a photosensitive semiconductor wafer. The EUV lithography system preferably further includes a projection optical system. The projection optical system is preferably arranged downstream of the reflective reticle and configured to receive reflected EUV radiation from the reflective reticle and form therefrom the patterned image on the photosensitive semiconductor wafer.

It is to be understood that both the foregoing general description and the following detailed description present example embodiments intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the invention and together with the description serve to explain the principles and operations of the disclosure. The drawings and the claims constitute part of this disclosure, and the claims shall be considered as being incorporated into and part of the detailed description set forth below.

Figure 1:
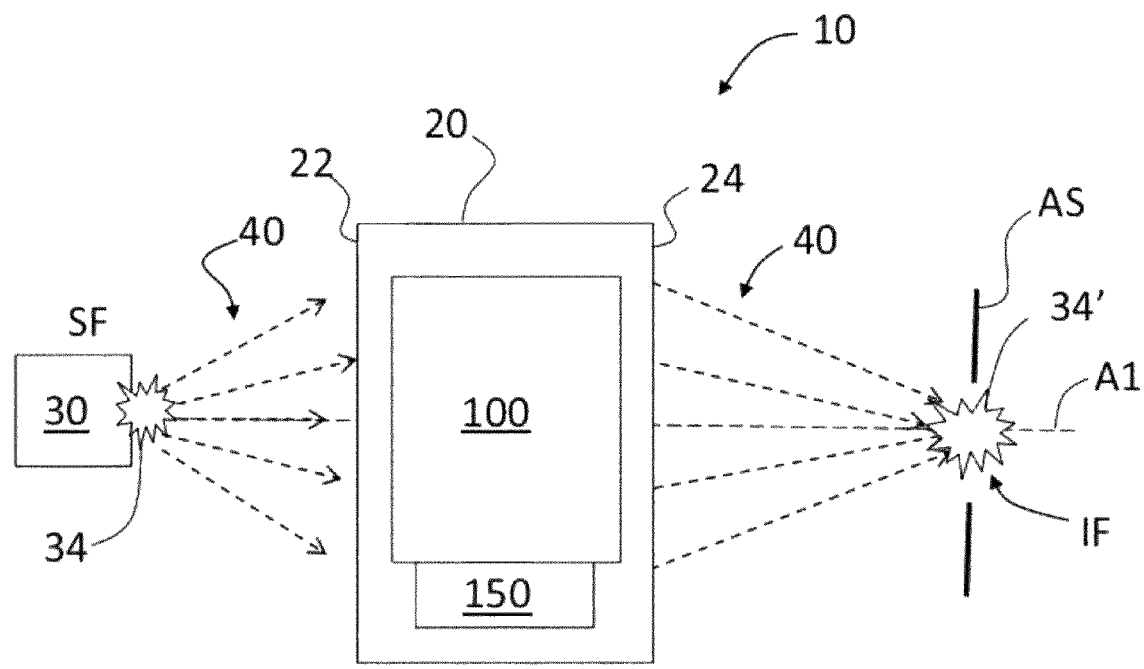
FIG. 1 is schematic diagram of an example EUV source-collector module or SOCOMO that has an axis and that includes a GIC mirror system.

The various elements depicted in the drawing are merely representational and are not necessarily drawn to scale. Certain sections thereof may be exaggerated, while others may be minimized. The drawing is intended to illustrate an example embodiment of the invention that can be understood and appropriately carried out by those of ordinary skill in the art.

DETAILED DESCRIPTION

FIG. 1 is schematic diagram of an example EUV source-collector module or SOCOMO 10 that has a central axis A1 and that includes a GIC mirror system 20 arranged along the central axis A1. GIC mirror system 20 has an input end 22 and an output end 24. GIC mirror system 20 also includes GIC mirror assembly 100 and a GIC shell cooling assembly 150 arranged in operative relation thereto, and which are discussed in greater detail below.

SOCOMO 10 includes an EUV radiation source system 30 arranged along central axis A1 adjacent input end 22 of GIC mirror system 20 and that generates an EUV radiation source 34 at a source focus SF. EUV radiation source 34 emits EUV radiation 40 having a wavelength of nominally 13.5 nm. Example EUV radiation source can be a laser-produced plasma (LPP) radiation source or a discharge-produced plasma (DPP) radiation source.

GIC mirror system 20 is configured to receive from EUV radiation source 34 a portion of EUV radiation 40 and collect the EUV radiation 40 at an intermediate focus IF adjacent output end 24 and along central axis A1, where an intermediate source image 34' is formed. When SOCOMO 10 is incorporated into an EUV lithography system, intermediate focus IF is located at or near an aperture stop AS for an EUV illuminator (see FIG. 19). An example EUV lithography system that uses GIC mirror system 20 is discussed in greater detail below.

Figure 2:
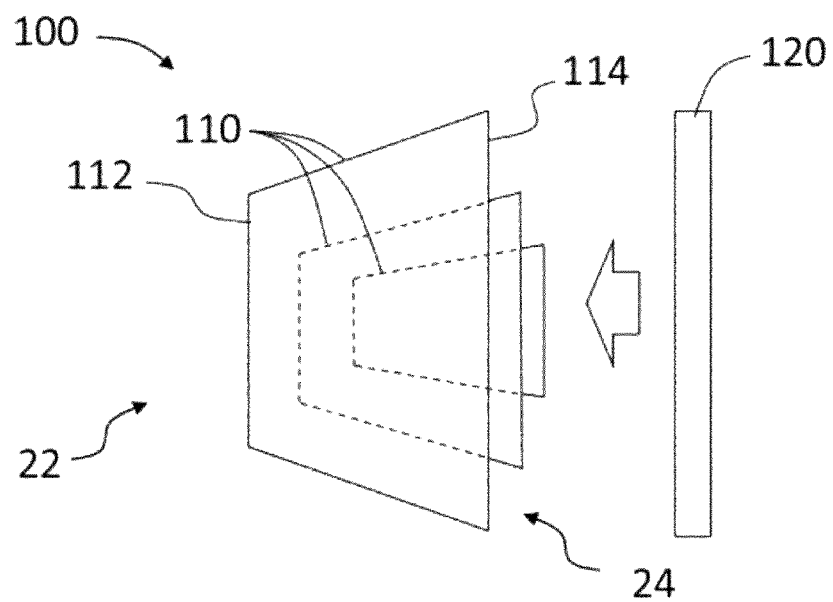
FIG. 2 is schematic side-view diagram of an example GIC mirror assembly that includes one or more GIC mirror shells ("GIC shells")
Figure 3:
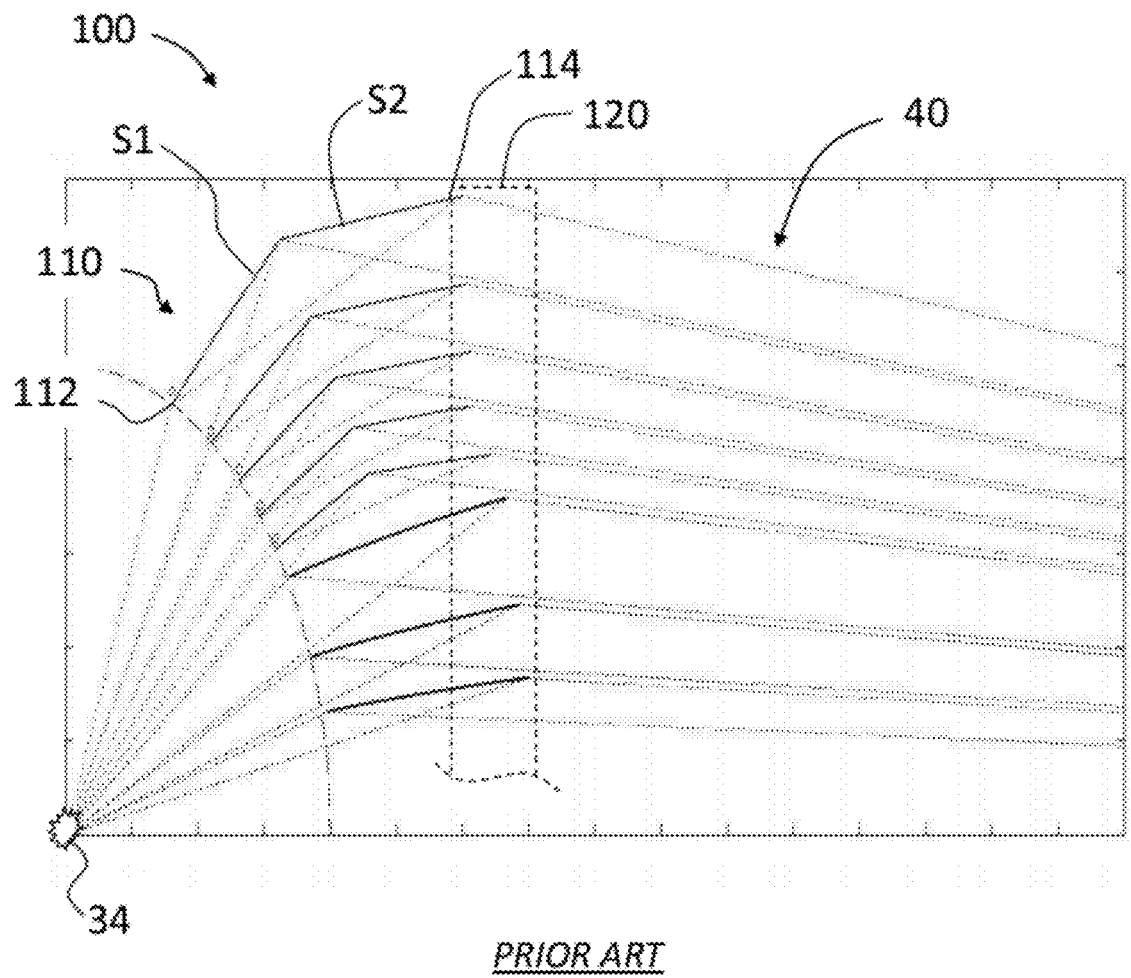
FIG. 3 is a cross-sectional view of a top-portion of an example GIC mirror assembly having eight GIC shells, where the outer five GIC shells utilize two bounces of the EUV radiation for imaging and therefore include two different shell sections.

FIG. 2 is schematic side-view diagram of an example GIC mirror assembly 100 that includes one or more GIC mirror shells ("GIC shells") 110, each having an input edge 112 at input end 22 and an output edge 114 at output end 24. GIC mirror assembly 100 includes a GIC shell support member 120 (also called a "spider") that supports the GIC shells 110 in a nested and spaced-apart configuration at their output edges 114. Example GIC mirror assemblies are disclosed in U.S. Patent Application Publication No. 2010/0284511, and in U.S. patent application Ser. No. 12/735,525 and Ser. No. 12/734,829, which are incorporated by reference herein. An example GIC shell support member 120 is disclosed in U.S. patent application Ser. No. 12/657,650, which is incorporated by reference herein. FIG. 3 is a cross-sectional view of a top-portion of an example GIC mirror assembly 100 having eight GIC shells 110, where the outer five GIC shells 110 include two different shell sections S1 and S2 having different curvatures and optionally different coatings.

Figure 4:
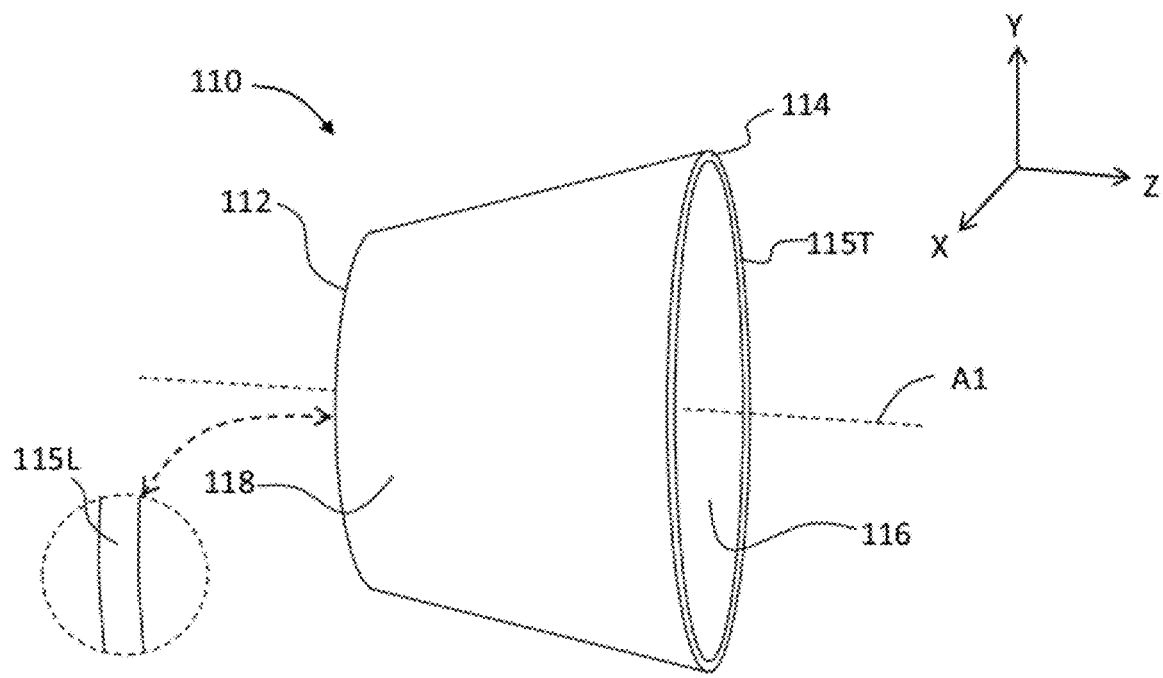
FIG. 4 is an isometric view of an example prior art GIC shell.

FIG. 4 is an isometric view of an example prior art GIC shell 110 that has an inner surface 116, an outer surface 118 and optional flanges 115L (see end-on inset) and 115T respectively formed at input and output edges 112 and 114. Cartesian coordinates are shown for reference. An example GIC shell 110 is formed by electroforming and is made of Nickel or Nickel alloy. An example range of thicknesses of GIC shell 110 is 1 mm to 4 mm, with 1 mm to 2 mm representing exemplary thicknesses.

Figure 5:
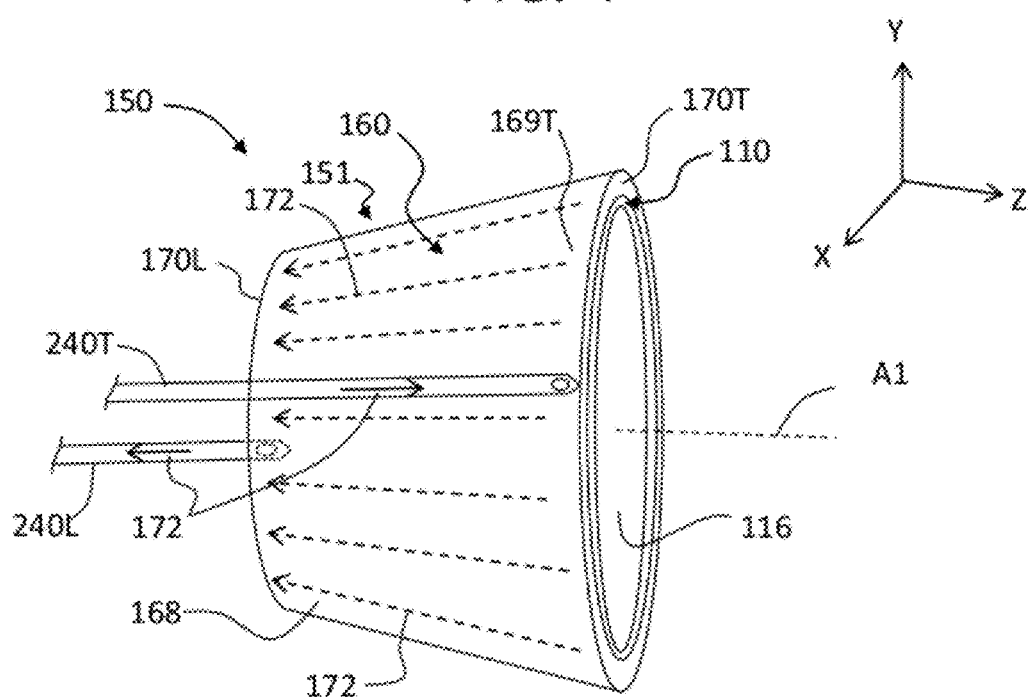
FIG. 5 is similar to FIG. 4, and illustrates an example GIC shell cooling assembly that includes a GIC shell with its outer surface surrounded by a jacket.
Figure 6:
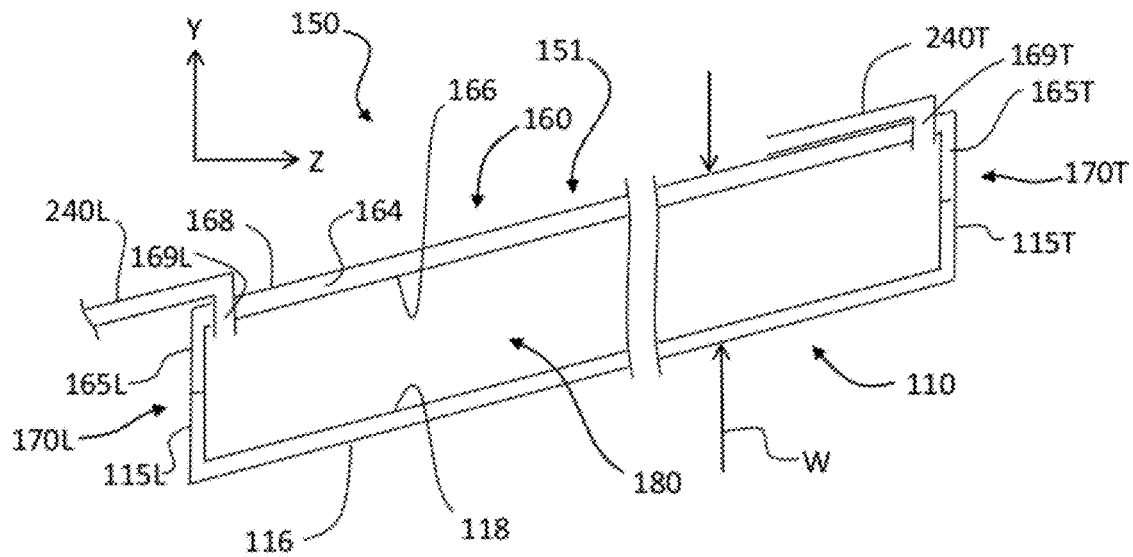
FIG. 6 is a Y-Z cross-sectional view of a portion of GIC shell cooling assembly, but without the OCHT material disposed within the chamber.

FIG. 5 is similar to FIG. 4 but illustrates an example GIC shell cooling assembly 150 that includes GIC shell 110 interfaced with a cooling structure 151 that includes jacket 160 that covers outer surface 118 of the GIC shell 110. FIG. 6 is a Y-Z cross-sectional view of a portion of GIC shell cooling assembly 150. Jacket 160 includes an outer wall 164 having an inner surface 166 and an outer surface 168, and optional end walls 165L and 165T.

GIC shell cooling assembly 150 includes a leading end 170L (also referred to as the input end) and a trailing end 170T (also referred to as the output end), with the leading end 170L being closest to EUV radiation source 34 and trailing end 170T farthest from the EUV radiation source 34 when the GIC shell cooling assembly 150 is incorporated into SOCOMO 10. In an example, outer wall 164 of the jacket 160 includes input and output apertures 169L and 169T adjacent end walls 165L and 165T, respectively, for flowing a coolant 172 (see FIG. 7) as discussed below. Example materials for jacket 160 include any machinable metal, with Nickel and Nickel alloy being exemplary choices. An example thickness for outer wall 164 of the jacket 160 is in the range from 1 mm to 3 mm.

jacket 160 and outer surface 118 of GIC shell 110 define a chamber 180 through which coolant 172 can flow. In an example, the width W from inner surface 116 of GIC shell 110 to outer surface 168 of the jacket 160 is in the range from 2 mm to 10 mm, with 3 mm to 7 mm being an exemplary range.

In a commercial EUV lithography system, the SOCOMO 10 is expected to be subjected to 20 kW to 60 KW, which represents an enormous thermal load. The thermal management of each GIC shell 110 must be implemented within the constraints of the optical design of the particular GIC mirror system 20. In particular, in GIC mirror systems 20 having multiple GIC shells 110, the GIC shells 110 are arranged in a nested and concentric (or substantially concentric) configuration (see e.g., FIG. 2 and FIG. 3), and the GIC shell cooling assembly components must fit within gaps or "dark regions" between the GIC shells 110 so that the optical pathways from the EUV radiation source 34 to the intermediate focus IF remain substantially unobstructed. The relatively narrow width of GIC shell cooling assembly 150 is amenable for forming a nested GIC mirror system 20 without substantially obstructing the optical pathways.

Figure 7:
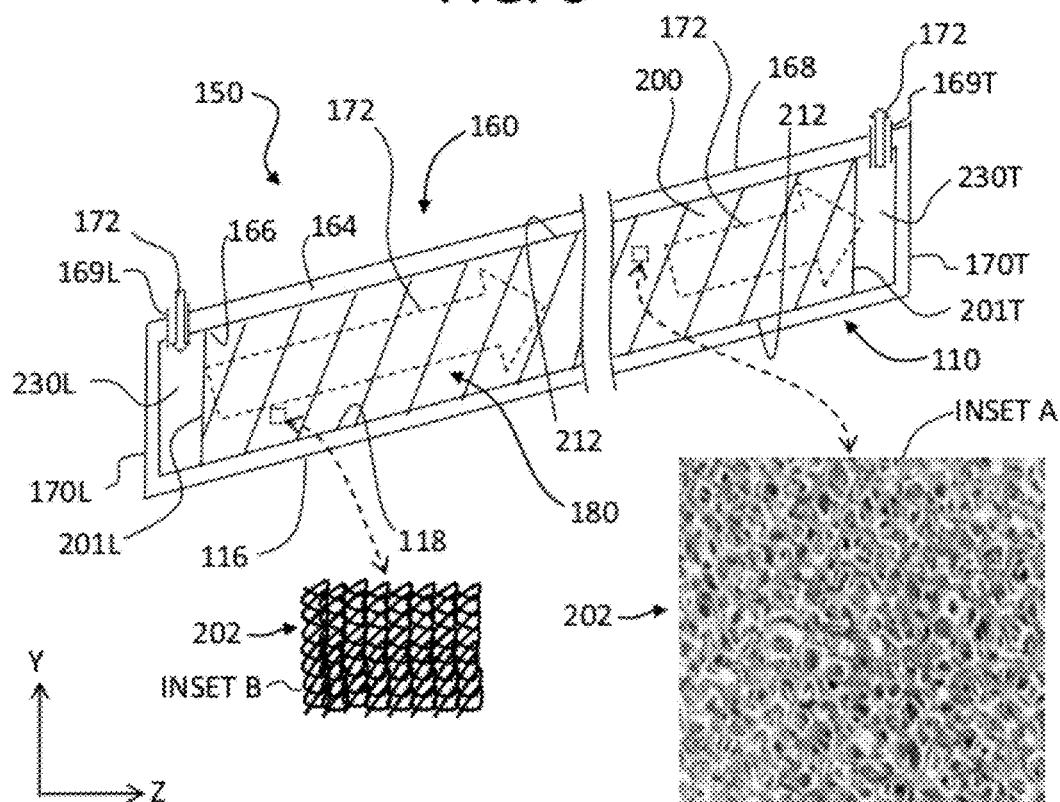
FIG. 7 is similar to FIG. 6 but includes an example layer and illustrates the flow of coolant through the layer from an input plenum to an output plenum.

With reference now to FIG. 7, GIC shell cooling assembly 150 further includes a layer 200 of an open cell heat transfer (OCHT) material 202. An example OCHT material 202 an open-cell, porous, thermally conducting (i.e., non-thermally insulating) material that has a high heat transfer. Layer 200 is configured so that OCHT material 202 substantially fills chamber 180. In an example, OCHT material 202 is rigid and has mechanically high tensile strength. An example OCHT material 202 is metal foam formed from any of a number of commercially available materials including Al, C, SiC, Cu and Ni, or constituted by solid metal or by a non-metal core structure (e.g., carbon) with a metal coating. In an example, the density of the metal foam can typically be in the range of 3-15% of solid density and an example pore size is in the range of 0.2-3 mm. An example metal foam has a pore density in the range of 20 to 100 pores per inch (PPI).

Another example OCHT material 202 comprises one or more springs or spring-like metal materials configured (e.g., as wrapped or a nested wrap of one or more lengths of springs) so that a coolant 172 can flow through the OCHT material 202 and remove heat.

Another example OCHT material 202 comprises a mesh, such as a copper or other type of metallic or metallic-coated mesh.

In an example, OCHT material 202 performs the following functions: 1) provides mechanical rigidity to prevent chamber 180 from expanding under high hydrostatic pressure when the OCHT material 202 is connected to (e.g., bonded to) GIC shell 110 and jacket 160; 2) generates micro-turbulence in the coolant flow to reduce or eliminate the formation of substantial boundary layers at outer surface 118 of the GIC shell 110 or inner surface 166 of the jacket 160; 3) transfer heat from GIC shell 110 via thermal conduction so that the flow of coolant 172 through the OCHT material 202 can remove heat from chamber 180; and 4) presents a relatively large effective surface area to efficiently transfer heat from the OCHT material 202 to the coolant 172 via thermal convection. In another example, the OCHT material 202 performs one or more of the above-described functions.

With reference to FIG. 7, layer 200 includes an inner surface 210 (which is really an "effective inner surface," given the porous nature of OCTM material 202) adjacent to outer surface 118 of the GIC shell 110 and an (effective) outer surface 212 adjacent to inner surface 166 of the jacket 160. In an example, inner surface 210 is conformal relative to outer surface 118 of the GIC shell 110 and outer surface 212 is conformal with inner surface 166 of the jacket 160. The two close-up insets INSET A and INSET B illustrate the aforementioned examples of metal-foam-based and spring-based OCHT materials 202.

In an example, end portions of chamber 180 adjacent leading and trailing ends 170L and 170T of the GIC shell cooling assembly 150 respectively serve as ring-shaped input and output plenums 230L and 230T through which coolant 172 can circumferentially flow. Other forms of plenums can be used, as described below in connection with FIG. 16B. In an example, at least one of input and output plenums 230L and 230T does not contain any OCHT material 202. In an example, layer 200 includes input and output ends 201L and 201T that serves to respectively define input and output plenums 230L and 230T that are void of OCHT material 202 so that coolant 172 can more freely flow therein and therethrough. It is generally preferred that there be a relatively low pressure drop in the input and output plenums 230L and 230T when feeding and removing coolant 172 thereto and therefrom so that coolant 172 has substantially uniform azimuthal flow.

Layer 200 is generally configured to control the heat transfer and coolant flow dynamics to optimize convective cooling of GIC shell 110 when the GIC shell 110 is used to collect EUV radiation 40. Layer 200 also preferably contributes to making jacket 160 mechanically stable under the hydrostatic pressure caused by the flow of coolant 172. An example range of expected hydrostatic pressure is 4 bars to 8 bars. Thus, an example OCHT material 202 has an elastic modulus of about 100 MPa or greater. Also in an example, the yield strength of the bonds that connect OCHT material 202 GIC shell 110 and jacket 160 is greater than about 10 bar=1 MPa.

In an example, the transfer of heat from GIC shell 110 into chamber 180 is maximized by increasing the effective surface area and thermal conductivity of layer 200. This corresponds to increasing the density and decreasing the pore size (or interstitial size) of OCHT material 202. However, high flow rates of coolant 172 are also required for effective cooling and, for a given pressure differential, the flow rate increases with lower density and larger pore (interstitial) size. The optimum cooling is thus obtained by balancing these competing factors.

Layer 200 acts as a convective cooling agent that significantly increases the effective thermally conducting surface area of the interface between coolant 172 and GIC shell 110. As a rule of thumb, each millimeter of thickness of metal foam layer 200 may add an amount of surface area that is substantially equivalent to the original surface area of inner surface 116 of the GIC shell 110. This will typically depend on the quality of the thermal contact between the metal foam and the GIS shell 110. Thus, to enhance the heat transfer, layer 200 is preferably in good thermal contact with GIC shell 110. Thus, in an example embodiment, layer 200 is thermally and mechanically contacted to outer surface 118 of the GIC shell 110 as well as to inner surface 166 of the jacket 160.

Figure 8:
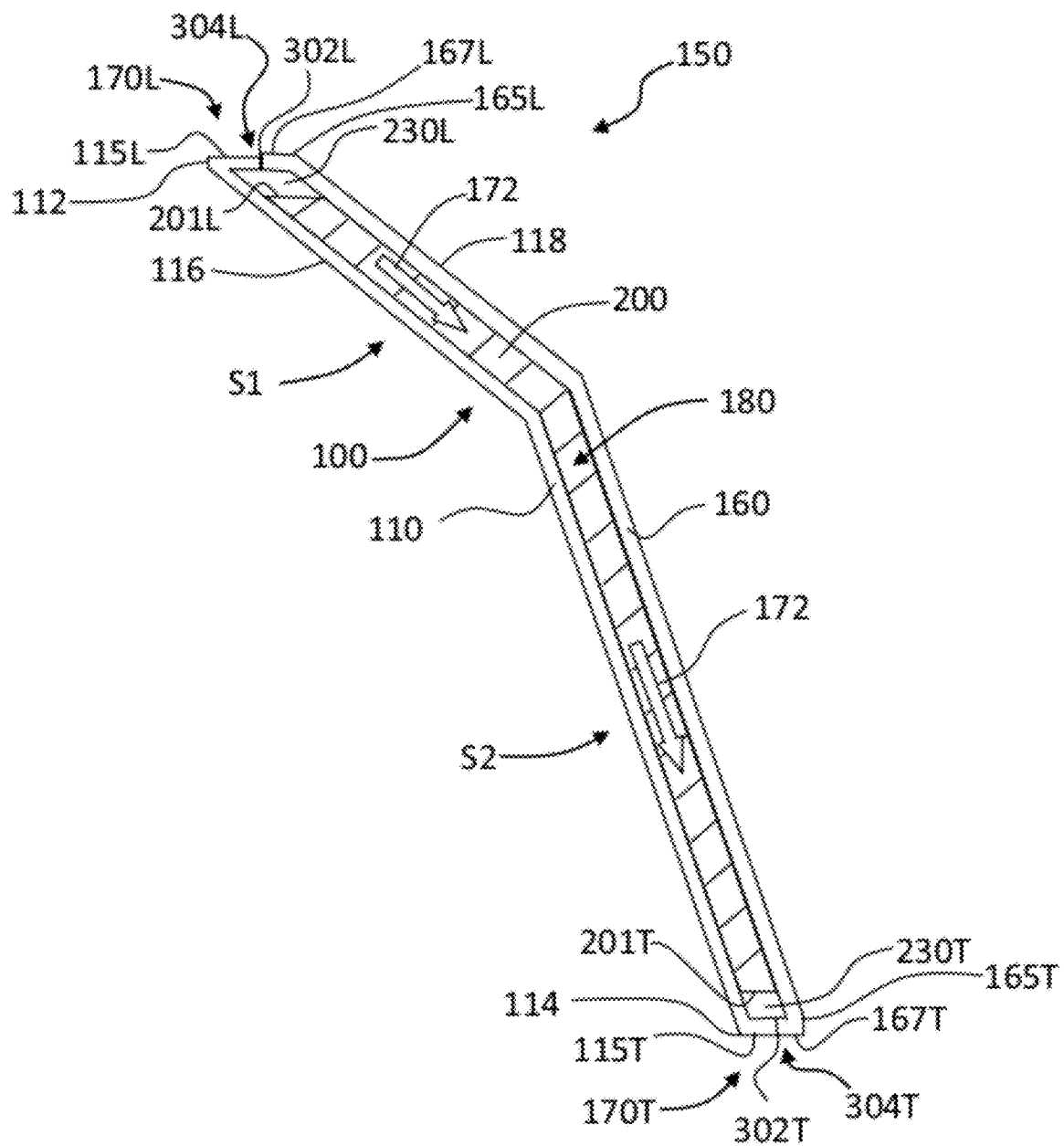
FIG. 8 is a Y-Z cross-sectional view of an example GIC shell cooling assembly that includes a GIC shell having two different mirror zones.

FIG. 8 is a Y-Z cross-sectional view of an example GIC shell cooling assembly 150 wherein GIC shell 110 includes two different shell sections S1 and S2 having different curvatures and optionally different reflectivity coatings. GIC shell 110 also includes two flanges 115L and 115T at its input and output edges 112 and 114. Likewise, jacket 160 includes flanges 167L and 167T at its input and output ends 165L and 165T. Another option for this configuration is to make flanges 115L and 115T of the GIC shell 110 larger and for jacket 160 to have no flanges. This latter option would serve to move the locations where GIC shell 110 and jacket 160 are secured (e.g., welded or brazed or even epoxied) to one another away from inner surface 116 of the GIC shell 110, i.e., the optical surface where the thermal loading from the source heating is greatest.

Figure 9:
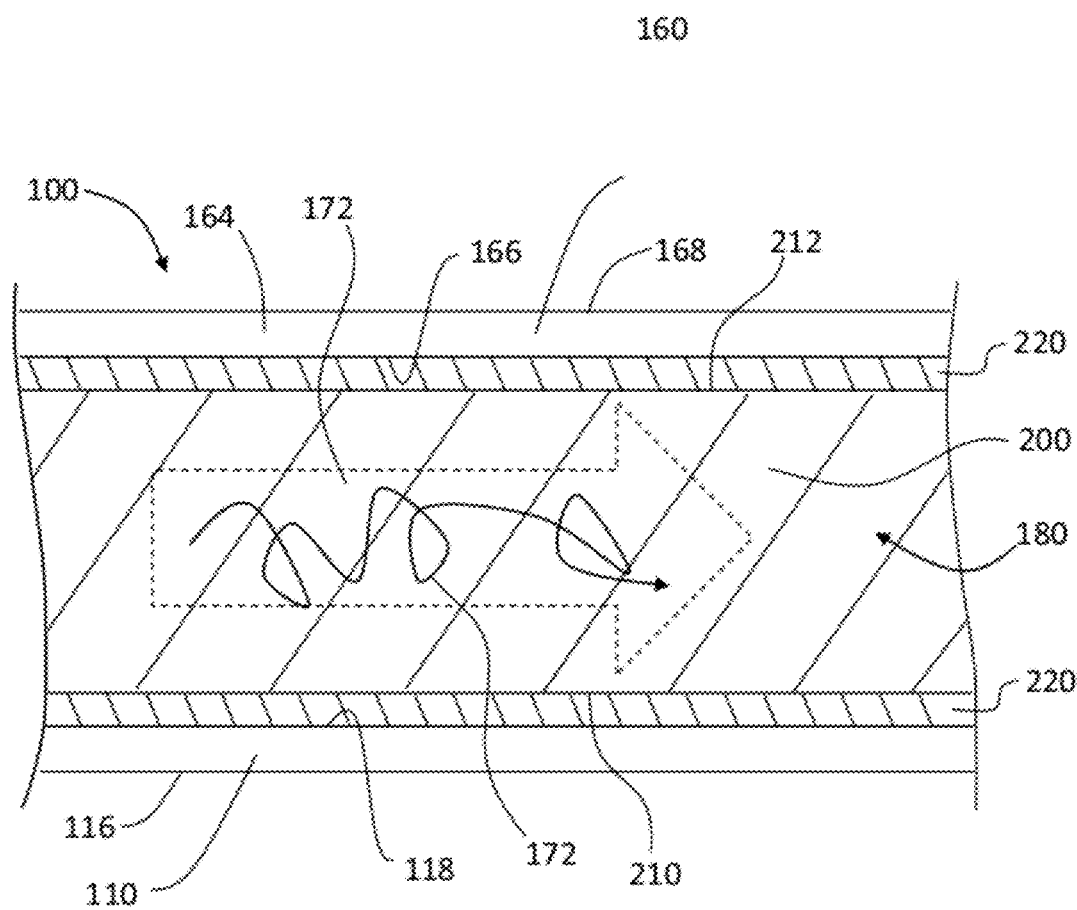
FIG. 9 is a close-up cross-sectional view of a GIC shell cooling assembly showing contact layers used to form a bond between the layer, the GIC shell and jacket.

With reference now to FIG. 9, in an example, respective intermediate contact layers 220 provide both thermal and mechanical contact between layer 200, inner wall 166 of the jacket 160 and outer surface 116 of the GIC shell 110. For example, once layer 200 is mechanically attached to outer surface 118 of the GIC shell 110 (e.g., before the GIC shell 110 is removed from its mandrel), it is submerged in a plating solution to deposit a thin layer (e.g., between 10 microns and 100 microns) of metal over surfaces 210 and 212 of layer 200, including the places where the layer 200 contacts GIC shell 110 and jacket 160. This process forms intermediate contact layer 220 that bonds inner surface 210 of the metal foam layer 200 to outer surface 118 of the GIC shell 110 and outer surface 212 of the layer 200 to inner surface 166 of the jacket 160. In this approach, intermediate contact layers 220 comprise a plating metal, which can be any high-conductivity metal. One particularly attractive choice for the plating metal is Ni, in order to minimize the variation between the foam and the GIC shell 110 (also Ni) of the coefficient of thermal expansion. In an example, the above-described electroforming process can coat inner surface of OCHT material 202. A variety of materials and processes can be used for intermediate contact layers 220 besides those described herein by way of illustration.

Another method for contacting layer 200 to at least one of outer surface 118 of the GIC shell 110 and inner surface 166 of the jacket 160 employs an electroless process. One such electroless process involves circulating the plating solution through chamber 180 after the GIC shell cooling assembly 150 is assembled. This approach has the advantage of contacting layer 200 to outer surface 118 of the GIC shell 110 and to inner surface 166 of the jacket 160. This configuration allows for sufficient cooling while also increasing the mechanical stiffness of GIC shell cooling assembly 150 by mechanically connecting GIC shell 110 and jacket 160 via layer 200. This further serves to reduce the possibility of mechanical distortion of GIC shell cooling assembly 150 and in particular reflective inner surface 116 of the GIC shell 110 when the pressurized coolant 172 is introduced to the GIC shell cooling assembly 150.

Another method for contacting layer 200 to at least one of outer surface 118 of the GIC shell 110 and inner surface 166 of the jacket 160 employs a thermally conducting pliable material (e.g., a paste), such as silver epoxy. An example silver epoxy thickness of intermediate contact layers 220 is between 100 and 200 microns thick. In an example, one can employ bonding techniques for the two surfaces 210 and 212 of layer 200. For example, an electroless Ni bonding approach that uses 25 micron to 100 microns of material may be used to bond layer 210 to one of the GIC shell 110 and the jacket 160, while a conducting epoxy that is hundreds of microns thick can be used to bond the remaining surface. A powder coating (e.g., with a thickness of between about 50 to 200 microns might be used. Powder coatings flow over and coat surfaces and so may prove useful when bonding an open-cell material such as OCHT material 202. An example embodiment includes using an electroforming method to bond the OCHT material 202 to the GIC shell 110 while the GIC shell 110 is still in contact with the mandrel, and then using an epoxy or a powder coating method or an electroless Nickel method to attach the OCHT material 202 to the jacket 160.

In an example embodiment, layer 200 is formed within chamber 180, as opposed to introducing externally fabricated layer 200. For example, a non-conducting matrix material such as vitreous carbon foam can be arranged in chamber 180, the chamber then sealed with jacket 160, and then the structure electroformed with Nickel to create a Ni-based metal foam OCHT material 202 within the chamber 180. In another example, chamber 180 can be filled with chips or filings of a conductive material and then the material electroformed to form the OCHT material 202. Also in an example, an electroforming process is used to form a nickel-based metal foam OCHT material 202.

An in situ method of layer 200 can be used to ensure that the layer 200 is substantially conformal with outer surface 118 of the GIC shell 110 and inner surface 166 of the jacket 160.

GIC Mirror System

Figure 10:
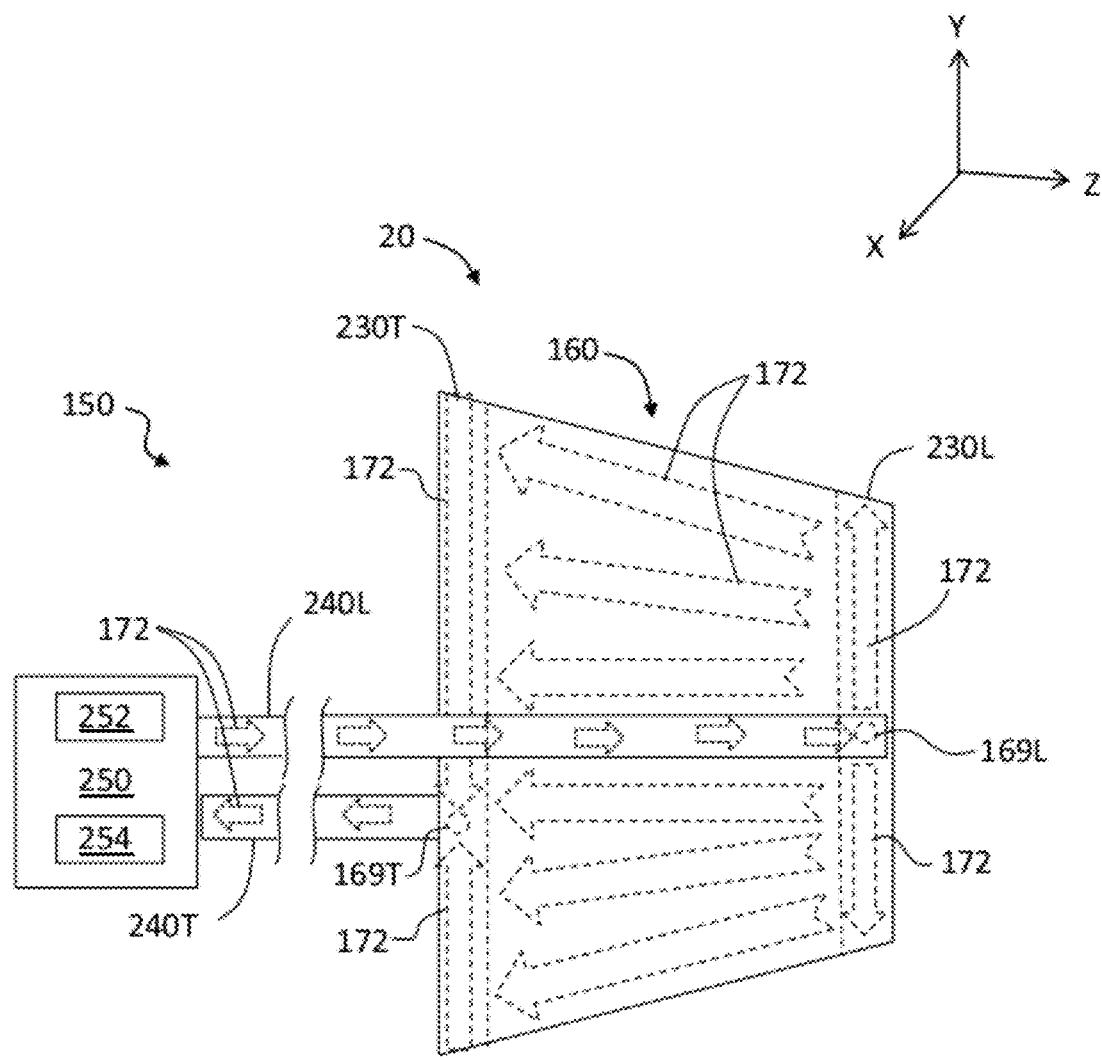
FIG. 10 is a schematic diagram of an example GIC mirror assembly with the GIC shell cooling assembly.

FIG. 10 is a schematic diagram of an example GIC mirror system 20 comprising GIC shell cooling assembly 150 integrated with GIC shell 110 (see FIG. 5). The example GIC mirror system 20 (see FIG. 1) of FIG. 10 shows only a single GIC shell 110. GIC shell cooling assembly 150 further includes a coolant supply unit 250 fluidly connected to the GIC shell cooling assembly 150 via an input cooling line 240L fluidly connected to input plenum 230L at input aperture 169L and an output cooling line 240T fluidly connected to output plenum 230T at output aperture 169T. Input and output cooling lines 240L and 240T are fluidly connected to coolant supply unit 250.

It is noted here that the input and output plenums 230L and 230T can be switched so that coolant 172 is introduced at the opposite end of the GIC shell cooling assembly 150, and the example shown in FIG. 10 is one example configuration.

Figure 11:
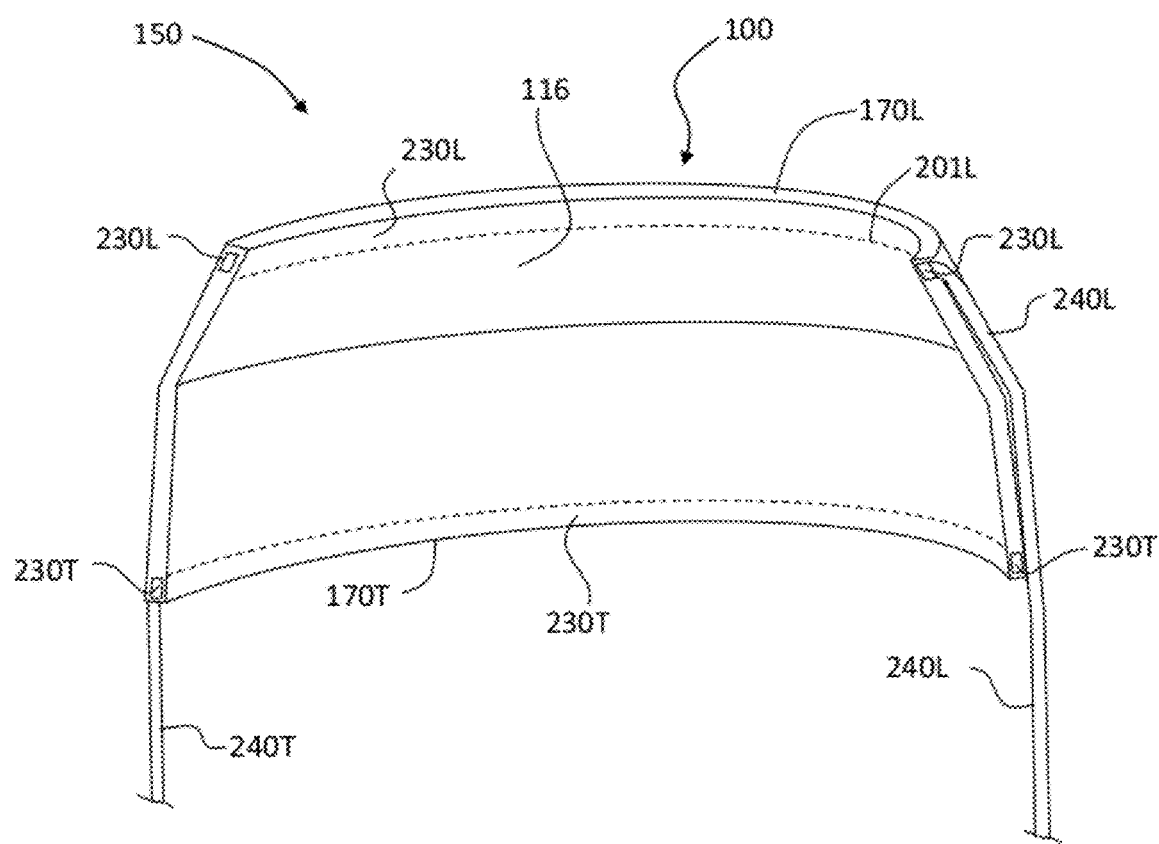
FIG. 11 is a cut-away view of a section of the GIC shell cooling assembly, and showing input and output cooling lines that connect the GIC shell cooling assembly to the coolant supply unit.

FIG. 11 is a cut-away view of a section of GIC shell cooling assembly 150 along with input and output cooling lines 240L and 240T. In another example, a GIC mirror assembly 100 having multiple GIC shells 110 and thus multiple GIC shell cooling assemblies 150 is used, with the GIC shell cooling assemblies 150 connected to a common coolant supply unit 250 or to separate cooling supply units.

In the general operation of GIC mirror system 20, EUV radiation 40, as well as other radiation from EUV radiation source 34, is incident upon reflective inner surface 116 of GIC shell 110, which receives and collects at least this narrowband EUV radiation 40 at intermediate focus IF (see FIG. 1). This process whereby EUV radiation 40 from the EUV radiation source 34 is incident on the GIC shell 110 serves to heat GIC shell 110. Thus, GIC mirror system 20 causes coolant supply unit 250 to provide coolant 172 to input plenum 230L. Coolant 172 flows under pressure around the ring-shaped input plenum 230L and also into annular-shaped chamber 180, including into layer 200 enclosed therein. Coolant 172 flows under pressure through layer 200 from the input plenum 230L to output plenum 230T. During its travel through layer 200, coolant 172 extracts heat from OCHT material 202 as the heat from the EUV radiation process is conducted from GIC shell 110 into layer 200.

The pressure drop ΔP between input and output plenums 230L and 230T is selected so that it does not substantially deform GIC mirror assembly 100. In an example embodiment, the input and output plenums 230L and 230T and their corresponding input and output cooling lines 240L and 240T are configured so that most of the pressure in chamber 180 is due to the pressure buildup in the input and output cooling lines 240L and 240T.

In an example, the pressure drop ΔP within chamber 180 (i.e., between the input and output plenums 230L and 230T) is less than 3 bars with a maximum pressure $P_{MAX}$ of 6 bars. A most desirable pressure drop would be about 1 bar or less. The amount of heat that needs to be removed, the heat capacity of the coolant 172 and the pressure drop ΔP defines the coolant flow rate. An example flow rate of coolant 172 is in the range of 10 to 60 liters/minute. Under different heat load conditions we can vary the flow rate to set the temperature difference across the GIC shell 110. It is estimated that the average temperature difference ΔT between leading and trailing ends 170L and 170T can be kept to as low as 1° C. In an example, ΔT is about a few degrees centigrade.

Jacket Connection to GIC Shell

In an example embodiment, jacket 160 is formed as a separate part from GIC shell 110 and so needs to be interfaced with GIC shell 110. The resulting chamber 180 needs to be sealed able to hold the internal pressure without mechanical failure or leakage and be vacuum-compatible, and conform to restrictive EUV lithography non-contamination requirements.

One method for interfacing jacket 160 and GIC shell 110 is via welding, e.g., to form a welded joint. With reference again to FIG. 8, in one example, flanges 115L and 115T of the GIC shell 110 and the corresponding flanges 167L and 167T of the jacket 160 are precision micro-welded together using either a laser or electron beam to form respective welded joints 302L and 302T that define respective interfaces 304L and 304T between GIC shell 110 and jacket 160.

In one example, the flanges are welded at their edges while in another example the flanges are overlapped and welded so that interfaces 304L and 304T have a greater surface area than an edge-to-edge interface. This approach keeps the localized heating associated with the welding process from affecting the active surface of the reflecting GIC shell 110. As noted above, GIC shell 110 may have larger flanges and jacket 160 may have no flanges, and the chamber 180 sealed at the flange edge of the GIC shell 110 and the edge of the jacket 160.

A consideration in forming GIC shell cooling assembly 150 is that stress can be introduced at one or more of interfaces 304L and 304T and deform GIC shell 110 during assembly of the GIC shell cooling assembly 150, thereby compromising the optical figure of reflective inner surface 116.

Thus, with reference to the close-up view of GIC shell cooling assemblies 150 of FIG. 12 through FIG. 15B, in an example embodiment, GIC shell cooling assembly 150 includes at least one compliant interface 304L and 304T. The compliant interface 304L and 304T is designed to be compliant when subjected to mechanical forces associated with assembling GIC shell cooling assembly 150, but not substantially compliant when subjected to hydrostatic pressures associated with the flow of coolant 172 through chamber 180 and OCHT material 202 contained therein.

Figure 12:
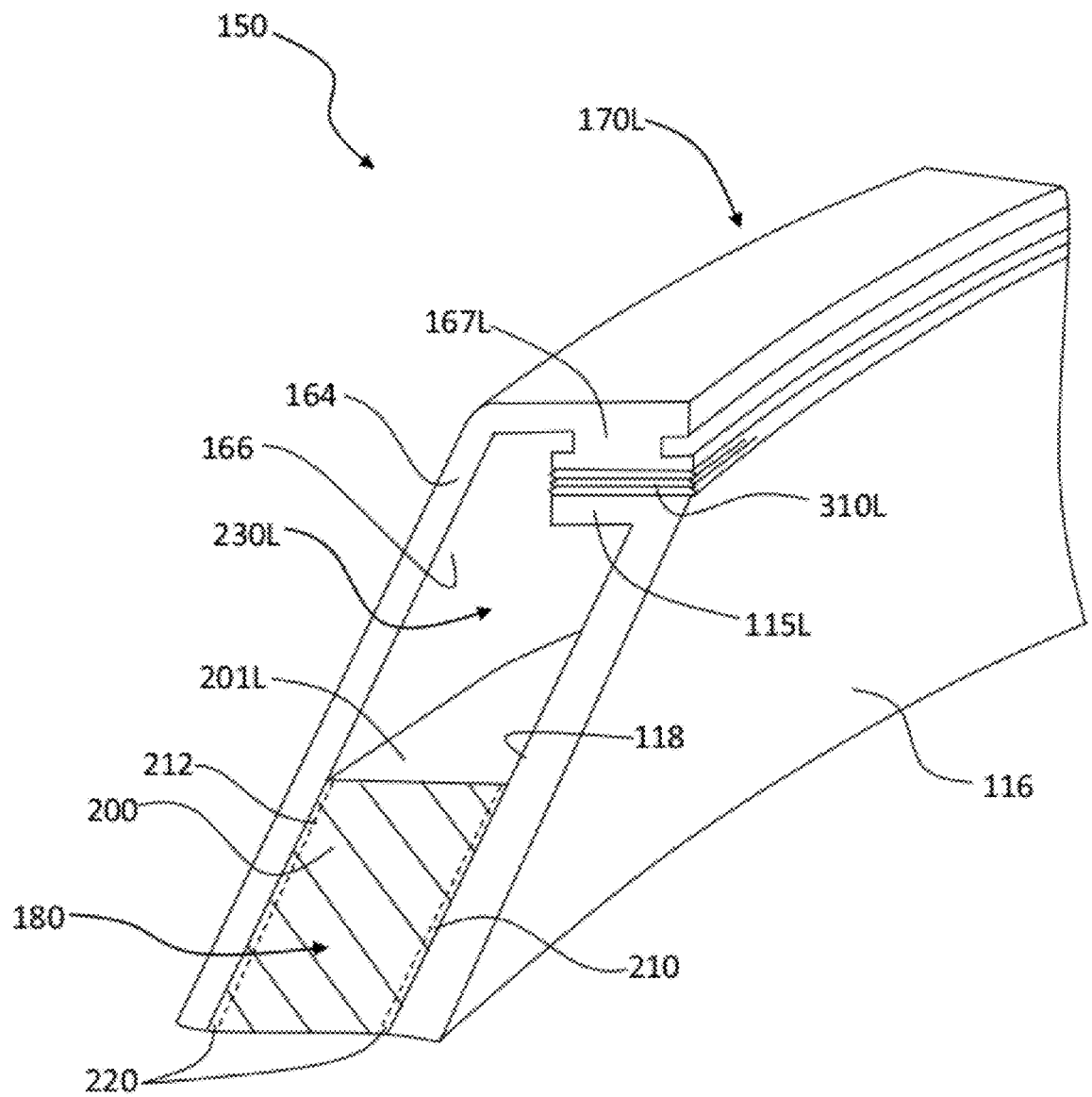
FIGS. 12 through 15B are various cross-sectional views of example GIC shell cooling assemblies that illustrate different embodiments for interfacing the GIC shell to the jacket, including the use of one or more compliant features.
Figure 13:
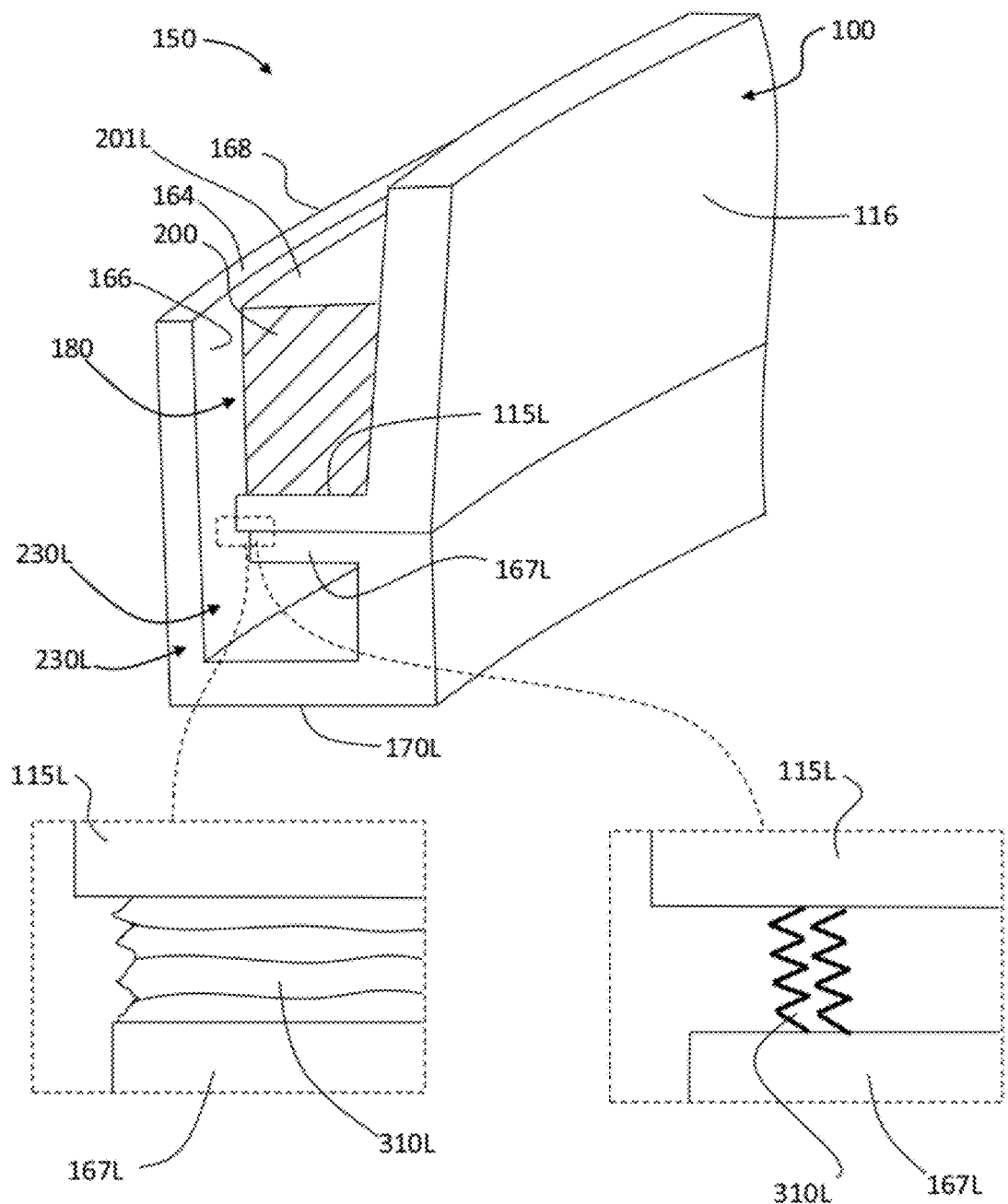

In one example, compliant interface 304L and 304T includes a compliant feature 310. In FIG. 12, compliant feature 310L is shown disposed between overlapping flange 115L of the GIC shell 110 and flange 167L of the jacket 160. In an example, compliant feature 310 comprises a hinge, a flexure, a bellows, a gasket, or grooved section of flange 115L of the GIC shell 110 or flange 167L of the jacket 160.

In another example, compliant feature 310 includes an epoxy with low outgassing properties. Compliant feature 310 is operable to absorb residual strain caused by interfacing GIC shell 110 and jacket 160 to prevent the residual strain from propagating to reflective inner surface 116 of the GIC shell 110 while also being substantially non-compliant when subjected to the hydrostatic forces associated with coolant flow during the operation of GIC shell cooling assembly 150. In another example, compliant interface 304L and 304T includes a welded or brazed joint.

Figure 14:
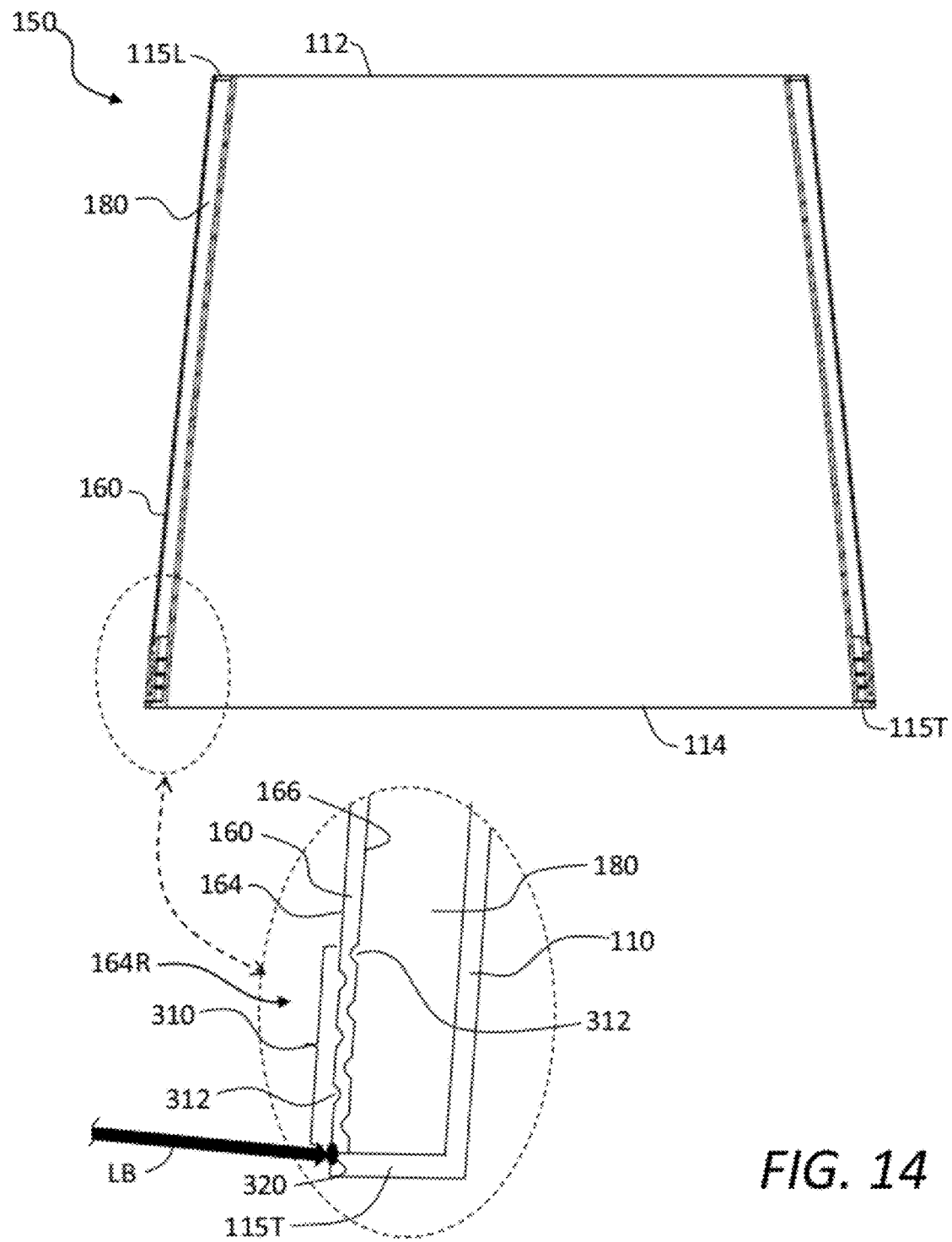
Figure 15A:
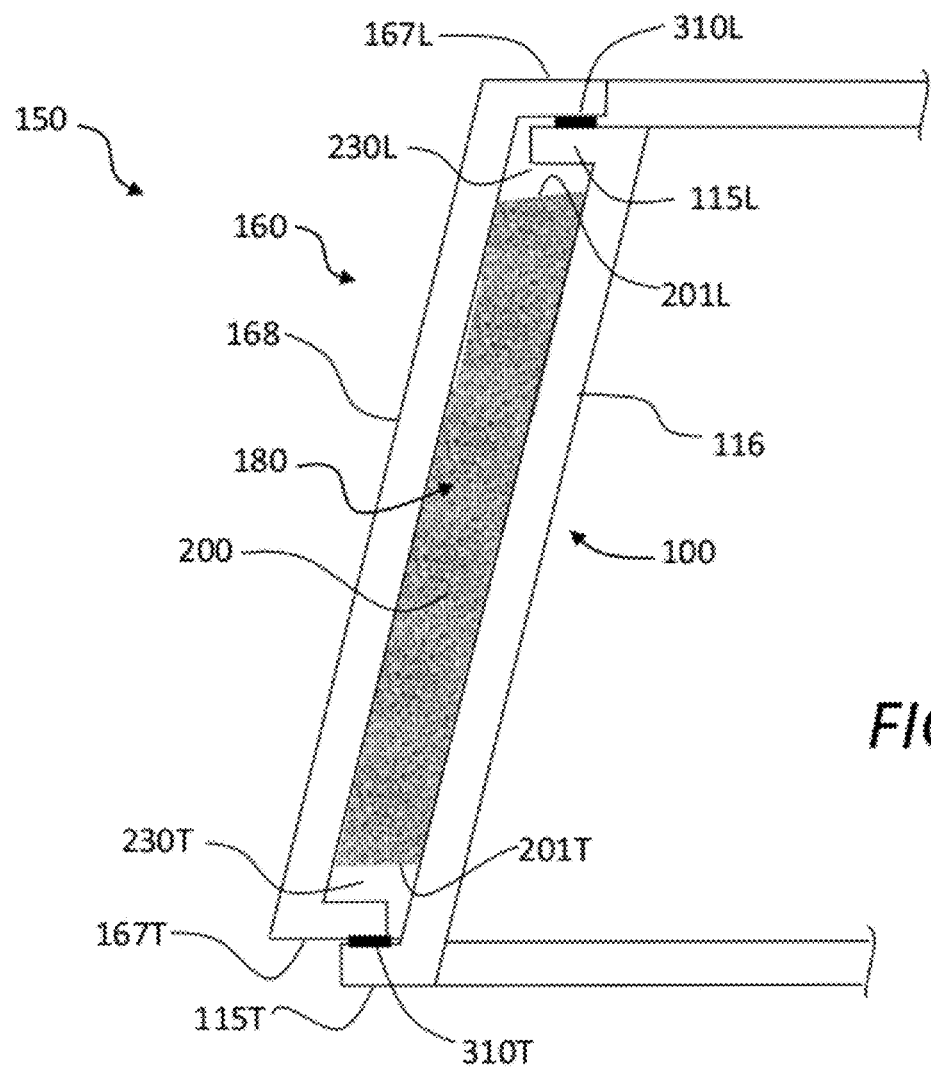
Figure 15B:
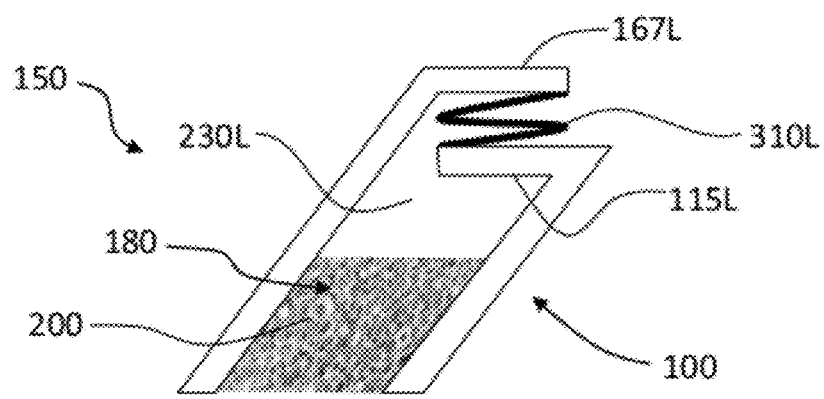

FIG. 14 is a cross-sectional view of an example GIC shell cooling assembly 150 that illustrates an example compliant feature 310. In the example of FIG. 14, trailing-edge flange 115T of the GIC shell 110 extends all the way to the edge of jacket 160, which has no flange. However, outer wall 164 of the jacket 160 includes an end region 164R configured as ring-type compliant feature 310 by the inclusion of grooves 312 formed on jacket wall inner and outer surfaces 166 and 168. Grooves 312 may be machined into outer wall 164 of the jacket 160 on one or both sides, with the latter embodiment shown in FIG. 14. Alternatively, the end region 164R of the jacket 160 may be a separate jacket piece that is formed separately from jacket 160 and then is attached (e.g., welded) thereto to create the ring-type complaint feature 310.

In an example, compliant feature 310 is formed by chemical milling or machining to remove material and provide a flexural capability to the otherwise rigid ring-like structure. The compliance of the compliant feature 310 can be varied by adjusting the amount of material removed.

Thus, in an example, the spacing and depth of grooves 312 are selected to provide the right balance of complaint feature 310 being compliant when subjected to mechanical stresses and strains associated with assembling GIC shell cooling assembly 150, while also being substantially non-compliant when subjected to hydrostatic forces associated with the flow of coolant 172.

One method to insure the non-compliance when subjected to hydrostatic forces associated with the flow of coolant 172 is to bond the OCHT material 202 to the compliant structure after the welding process is completed. In this way, there is compliance when the high temperature welding process occurs, but then the bonding is employed which provides rigid structure and support to the otherwise compliant feature 310 before the hydrostatic pressure from the flow of coolant 172 is introduced.

In an example jacket 160 is spot-welded at various locations at the interface between trailing-edge flange 115T and the corresponding jacket edge. An example spot-weld 320 formed using a laser beam LB is shown by way of illustration. The laser welding process is carried out, for example, by placing the partially assembled GIC shell cooling assembly 150 on a turntable and then spot welding at various locations at the flange-edge interface. The process can then be repeated as the turntable spins to form the final laser weld that yields a good seal between jacket 160 and GIC shell 110.

As discussed above, sealed GIC shell cooling assembly 150 supports closed-loop circulation of coolant 172 through chamber 180 and OCHT material 202 therein to convectively remove heat from GIC shell 110. Coolant 172 can be either gas or liquid. For smaller absorbed thermal loads of up to about 1 kW per GIC shell 110, a gas coolant 172 such as He can be used. For larger thermal loads ranging up to the maximum anticipated load of about 10 kW per GIC shell 110, coolant 172 is preferably a liquid such as water. In either case, coolant supply unit 250 preferably includes a filtration unit 252 operable to remove small particulates (>5 microns) that can deposit in and clog the pores of a metal foam.

The conformal geometry of HHT metal foam layer 200 within chamber 180 allows coolant 172 to flow uniformly through the metal foam layer 200. In certain instances, it may be preferable to flow coolant 172 from leading end 170L to trailing end 170T of GIC shell cooling assembly 150. Thus, in the examples discussed herein, the leading-end plenum 230L is referred to as the input plenum. However, as mentioned above, GIC shell cooling assembly 150 can be configured so that coolant 172 flows from trailing-end plenum 230T to leading-end plenum 230L. The input plenum 230L may also be located at a location other than at an edge of the GIC shell cooling assembly 150, such as described in greater detail below.

In one example that seeks to achieve substantially azimuthally symmetric coolant flow, the pressure drop $\Delta P$ across the azimuthal length of input plenum 230L is made small, e.g., smaller than 1 bar and preferably substantially smaller than 1 bar.

In one example that seeks to achieve optimum temperature control of GIC shell 110, the temperature of coolant 172 is maintained at or close to the ambient temperature. For the anticipated thermal loads associated with a commercially viable SOCOMO 10, such cooling requires relatively high coolant flow rates. For example, when coolant 172 is water and the flow rate is 60 liters/minute, the energy balance in high power loading conditions requires that there be an increase in the water temperature of 1° C. for every 4 kW of power removed. Such high flow rates imply high operating pressures with corresponding high flow velocities.

In particular, the momentum of coolant 172 entering input plenum 230L from input cooling line 240L must be dissipated without applying significant force to GIC shell 110. To this end, in an example, the flow of coolant 172 from coolant supply unit 250 can be introduced tangentially to GIC shell 110 via input plenum 230L, or in a zig-zag configuration discussed in greater detail in connection with the example shown in FIG. 16.

An example input plenum 230L is either void of OCHT material 202 or contains a more porous (e.g., lower density, larger pore size) OCHT material 202. Coolant 172 then circulates about the circumference of input plenum 230L while also uniformly feeding coolant 172 into layer 200. This coolant 172 then flows from input plenum 230L to output plenum 230T through OCHT material 202 preferably without having a substantial circumferential flow component once the coolant flow is initiated and reaches an equilibrium flow state. The avoidance of a circumferential flow facilitates azimuthally symmetric cooling.

The cross-sectional area of chamber 180 can be relatively large due to the large diameter of some GIC shells 110. For example, if chamber 180 contains a 3 mm thick metal foam layer 200 on a 200 mm diameter GIC shell 110, the cross-sectional area of chamber 180 is 19 cm$^2$. The pressure drop $\Delta P$ from input plenum 230L to output plenum 230T is expected to be small for such a large cross-section, even at a relatively high required coolant flow rates of up to about 60 liters/minute. However, the flow of coolant 172 can create an unacceptable deformation inner (reflecting) surface 116 of the GIC shell 110 due to hydrostatic pressure applied to outer surface 118 of the GIC shell 110. In instances where such deformation could present an issue, the contact between layer 200 with jacket 160 and GIC shell 110 is made in a manner that provides a strong bond so that the layer contributes significantly to the structural integrity of GIC shell cooling assembly 150.

An example method for reducing the hydrostatic pressure is to employ a 'push-pull' pumping configuration for the coolant circulation. In this approach coolant supply unit 250 includes a suction pump 254 added to output cooling line 240T and operated to reduce the average pressure inside the chamber 180.

Figure 16A:
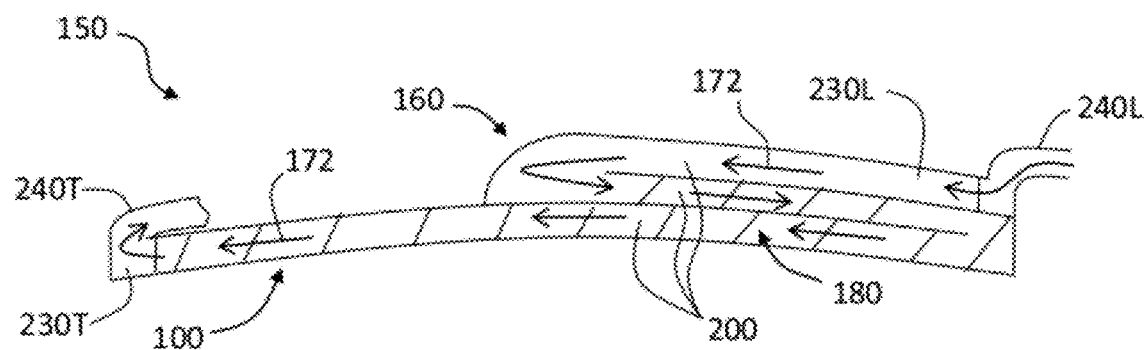
FIG. 16A is a cross-sectional view of an example GIC shell cooling assembly that includes an extended input plenum illustrating that an example plenum design accommodates flow dynamic conditions that allow for an azimuthally symmetric coolant feed to and through the OCHT material in the GIC shell cooling assembly at the high flow rates necessary to keep the temperature of the GIC shell well managed.

FIG. 16A is a schematic cross-sectional view of an example GIC shell cooling assembly 150 where the cross-sectional area of input plenum 230L is increased by extending the input plenum 230L. Here, input plenum 230L is folded over on itself so that the flow path of coolant 172 within the input plenum 230L has a zig-zag section. Input plenum 230L may include OCHT material 202, which may have a porosity different than (e.g., less than) the OCHT material 202 that resides adjacent outer surface 118 of the GIC shell 110, or it may be void of any OCHT material 202.

The extended input plenum 230L is arranged so that it resides in the aforementioned "dark space" when GIC shell cooling assembly 150 is incorporated into a GIC mirror assembly 100 that includes nested GIC shells 110.

Figure 16B:
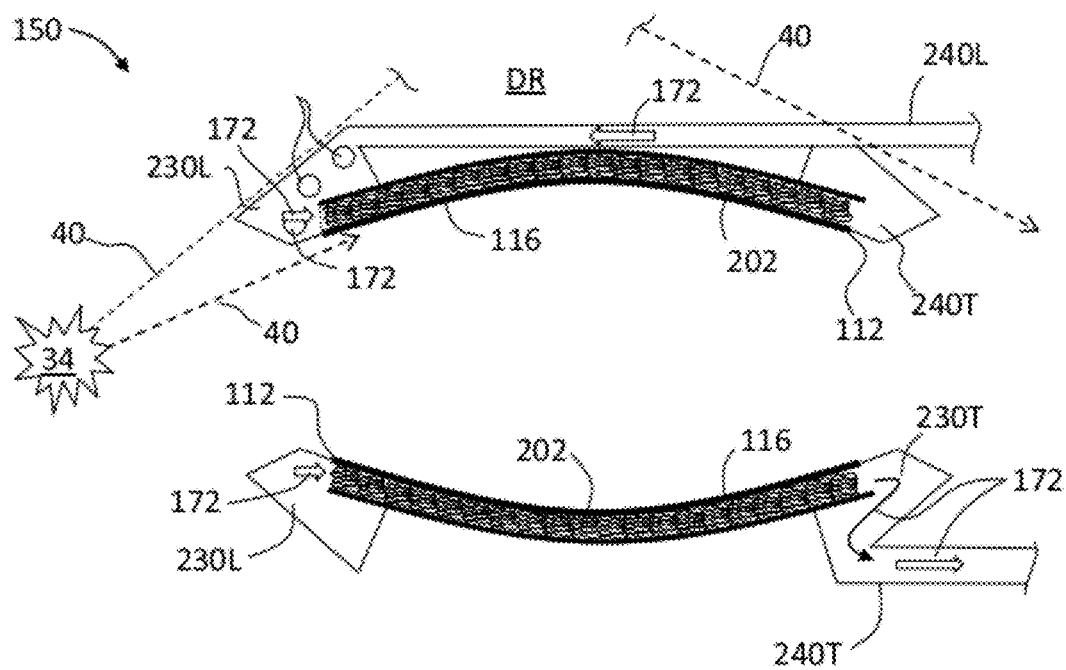
FIG. 16B is a cross-sectional view of an example GIC mirror assembly shown in relation to a EUV radiation source, illustrating an example of a plenum architecture for the GIC shell cooling assembly illustrating that an example plenum design accommodates flow dynamic conditions that allow for an azimuthally symmetric coolant feed to and through the OCHT material in the GIC shell cooling assembly at the high flow rates necessary to keep the temperature of the GIC shell well managed.

FIG. 16B is a cross-sectional view of an example GIC mirror assembly 100 shown in relation to a EUV radiation source 34, illustrating an example of a plenum architecture for GIC shell cooling assembly 150. Input and output plenums 230L and 230T are built into jacket 160 and within the shadow area or "dark region" DR between GIC shells 110. Input cooling line 240L leads from the output edge 114 of the GIC shell 110 to the input edge 112 through dark region DR. Coolant 172 is fed into input plenum 230L at an angle to create a circumferential vortex and have a good fill of the input plenum 230L.

Coolant 172 is thus distributed along the entire circumference of input plenum 230L in a larger plenum region and then into a smaller region small plenum. Coolant 172 then flows primarily axially through the OCHT material 202 within chamber 180 and to output plenum 230T. Coolant 172 is then removed from output plenum 230T via output cooling line 240T.

Figure 16C:
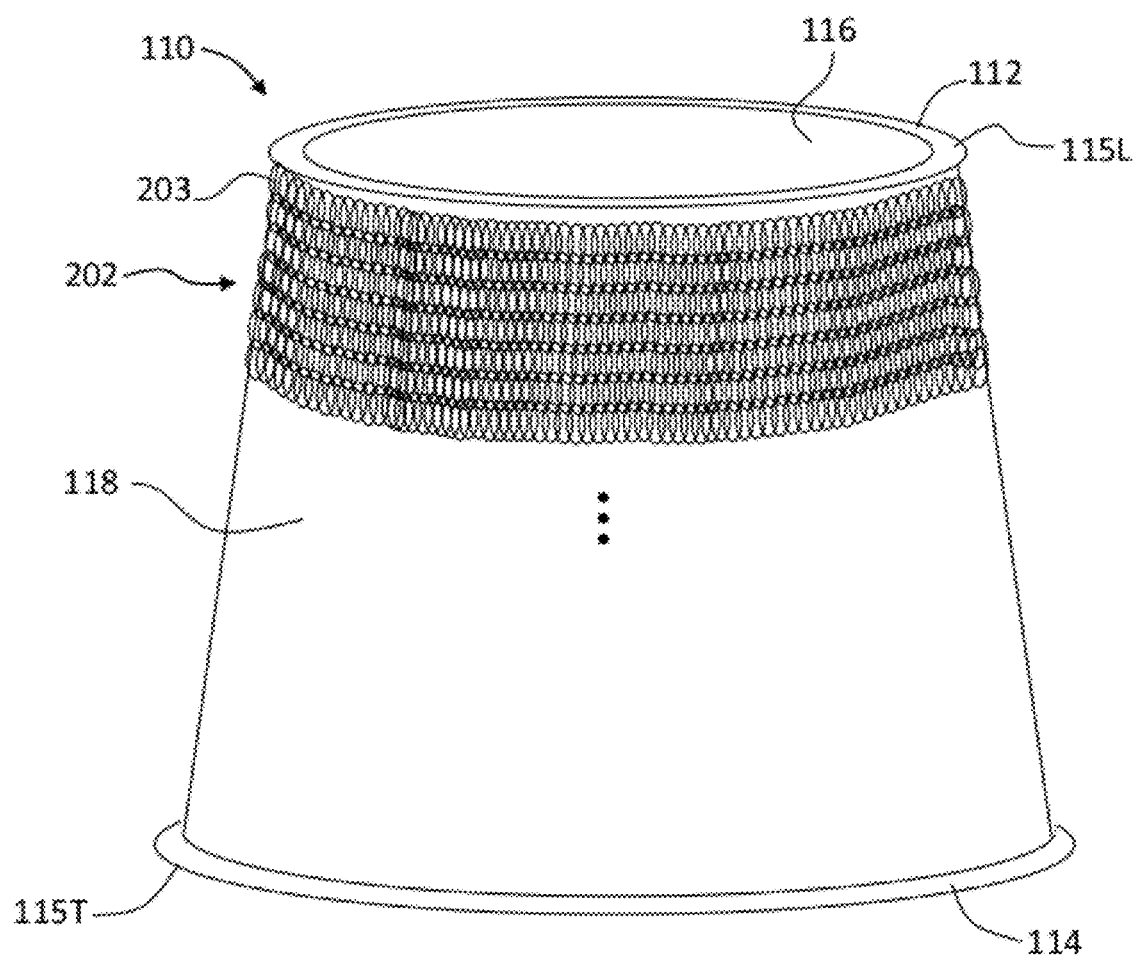
FIG. 16C is a side-view of an example GIC shell with an example OCHT material in the form of one or more metal springs wound around the outer surface of the GIC shell.

FIG. 16C is a side-view of an example GIC shell 110 with an example OCHT material 202 in the form of one or more lengths of springs 203 wound around the outer surface 118 of the GIC shell 110.

In an example, the spring configuration will be optimized to maximize the effective heat transfer to the coolant 172. In doing so, a guiding rule of thumb for spring configuration design is to have a ratio of d/D>0.2, where d=diameter of the spring wire material and D=the loop diameter of the spring 203. In an example, the spring loop separation along the spring length should be approximately 2d and the center-to-center separation (along the axis of the GIC shell 110) of adjacent springs 203 should be approximately D. In FIG. 16C, only the upper portion of the GIC shell 110 is shown covered with spring(s) 203 for ease of illustration.

Figure 16D:
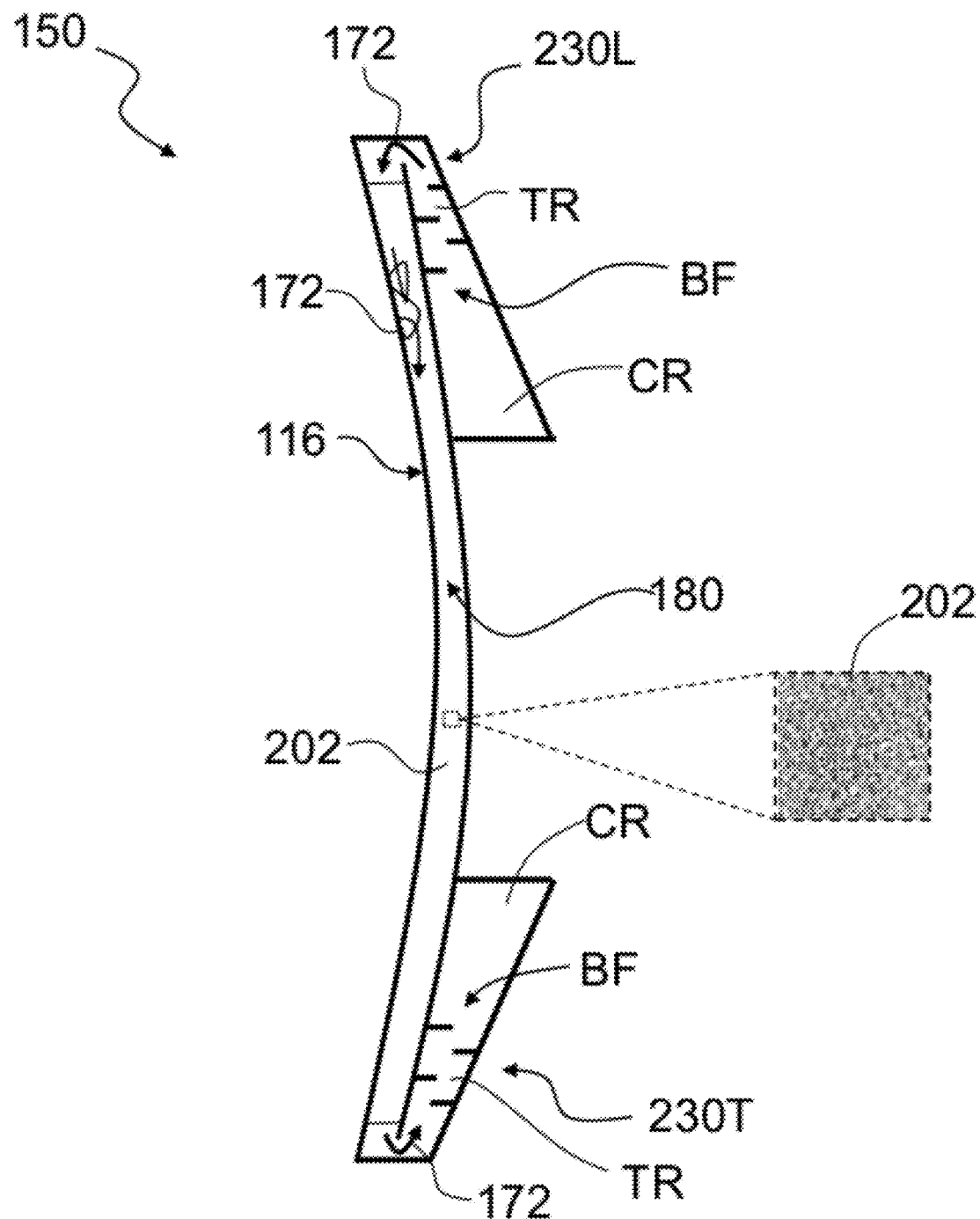
FIG. 16D is a cross-sectional view of an example GIC shell cooling assembly illustrating another example configuration for the input and output plenums.

FIG. 16D is a cross-sectional view of another example of GIC shell cooling assembly 150 showing the input and output plenums 230L and 230T with flow transition regions TR defined by baffles BF, and a main circulation region CR farther removed from the respective input and output edges 112 and 114. Coolant 172 is introduced to the circulation region CR of the input plenum 230L at the input edge 112. The transition region TR converts the azimuthal flow in the circulation region CR to axial flow that feeds the cooling jacket uniformly. The coolant flows through the OCHT material 202 and is ejected into the transition region TR of the output plenum 230T at the output edge 114. The flow then transforms from axial to azimuthal flow in the circulation region CR of the output plenum 230T.

For optimal thermal management performance, the pressure drop for one trip around the circulation region CR should be much less than the pressure drop across the transition region TR. In particular, a coolant-fluid molecule (e.g., water molecule) injected into the input plenum 230L should preferably circulate several times before it migrates into the cooling jacket 160. Similarly, a coolant-fluid molecule exiting the jacket 160 should circulate several times in the output plenum 230T before entering the output cooling line 240T.

The size of the input and output plenums 230L and 230T is generally determined by the cross-sectional area required to minimize the pressure in the circulation region CR. The pressure gradient in a square channel at flow rate w is given by, $$\frac{dp}{dx} = \frac{\rho f w^2}{2A^{5/2}} \qquad (1)$$

Here $\rho$ is the water mass density (1000 kg/m$^3$) and f is the friction coefficient.

A reasonable value for the friction coefficient in the case of turbulent flow and smooth walls is 0.02. For a flow rate of 15 l/min ($5 \times 10^{-4}$ m$^3$/s), to obtain a manageable pressure gradient of 0.05 bar/m requires a cross-sectional area of 1.9 cm$^2$. This is why the plenum 230L and 230T should be located on the outside of the cooling jacket 160 where more space is available.

Modeling of the cooling jacket 160 showed that the flow in the circulation region CR tends to expand axially and spill into the jacket 160 well before completing a revolution in the plenum 230L and 230T. This indicates that the plenum 230L and 230T also needs a transition region TR of relatively high pressure that converts the azimuthal flow to a uniform axial flow into the jacket 160. The pressure in the transition region TR can be controlled using baffles BF to decrease the effective channel size as shown in FIG. 16D.

In the case of the output plenum 230T, the baffles BF can be tilted to help form the azimuthal flow in the circulation region CR. The input and output cooling lines 240L and 240T should be oriented in the azimuthal direction to facilitate the circulation.

In an example, coolant 172 is filtered and conditioned to prevent algae growth and/or clogging.

GIC Cooling Assembly with Heat Shield

Figure 17A:
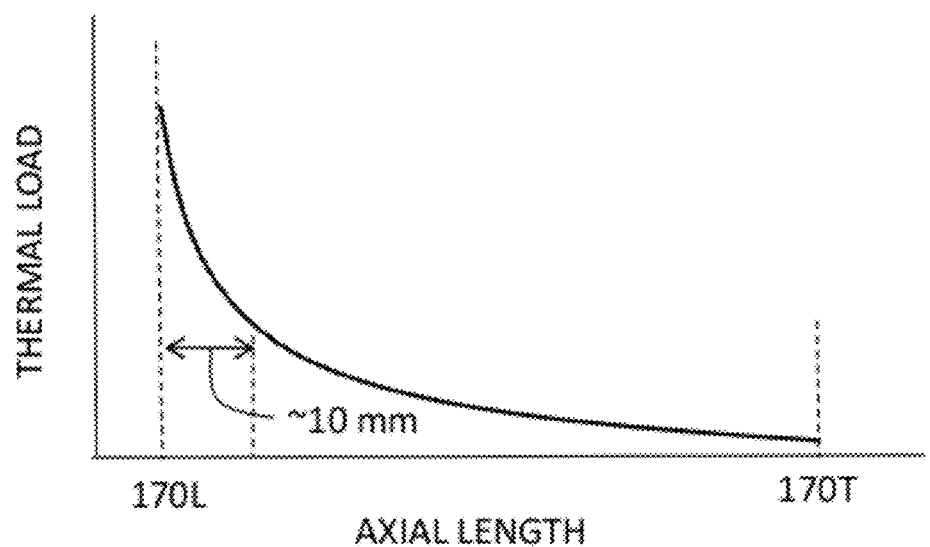
FIG. 17A is a conceptual schematic plot of the thermal load versus axial distance along reflecting inner surface of the GIC shell when the GIC shell cooling assembly is incorporated into a SOCOMO and exposed to EUV radiation and the power loading from the EUV radiation source.

FIG. 17A is a conceptual schematic plot of the thermal load (arbitrary units) as a function of axial length along inner (reflecting) surface 116 of GIC shell 110 for a GIC shell cooling assembly 150 arranged in a SOCOMO 10 and subjected to EUV radiation 40, as well as other thermal loading. It is expected that most of the thermal load occurs at leading end 170L, e.g., models indicate that about 20% of the thermal load is absorbed over the first 10 mm closest to the leading end 170L. Thus, for a 5 kW thermal load, the GIC shell 110 at leading end 170L can experience about a 1 kW thermal load. The thermal load illustrated in FIG. 17A is capable of being thermal managed by the thermal management systems disclosed herein.

Figure 17B:
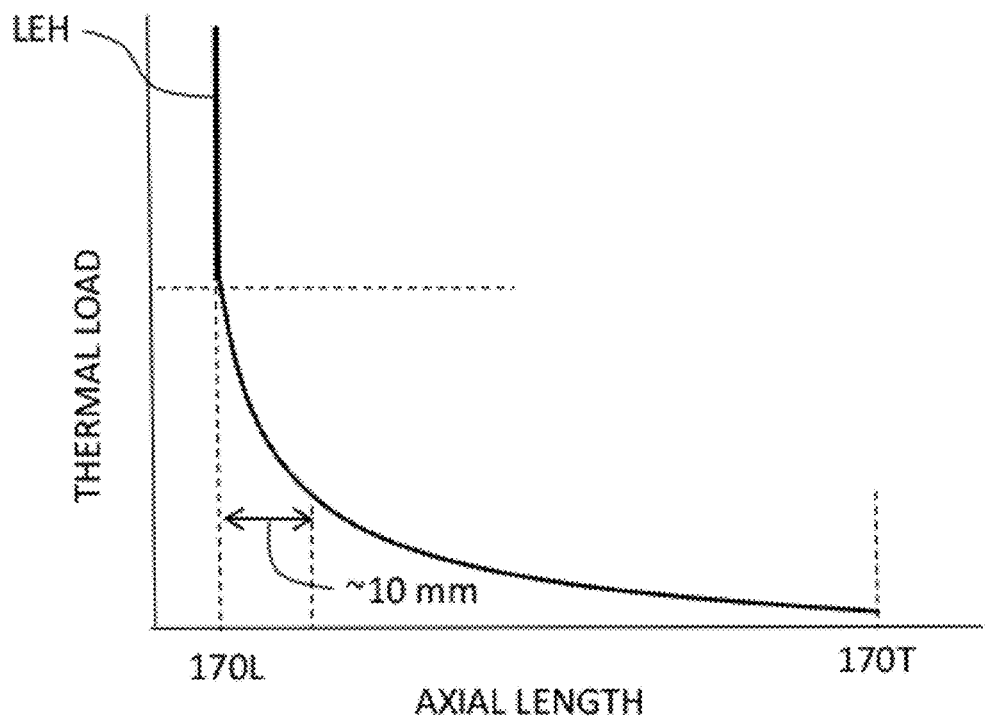
FIG. 17B is a plot similar to that of FIG. 17A, but additionally includes the amount of thermal loading of the GIC shell cooling assembly at its leading end if there is no shield protecting the leading end.

FIG. 17B is similar to FIG. 17A, except that it shows the actual expected thermal load on the entire GIC shell cooling assembly 150, including the very leading end 170L, for example the flange 115L of the GIC shell 110 which serves a mechanical not an optical function. So there is a very large amount of heat ("leading edge heat") LEH that will need to be dissipated at the leading end 170L. Rather than trying to manage this intense leading end thermal load using only the thermal management systems described above, in an example embodiment, an additional heat shield is used to reduce the amount of this leading-end heating which is incident on the non-optical leading surface.

Figure 18A:
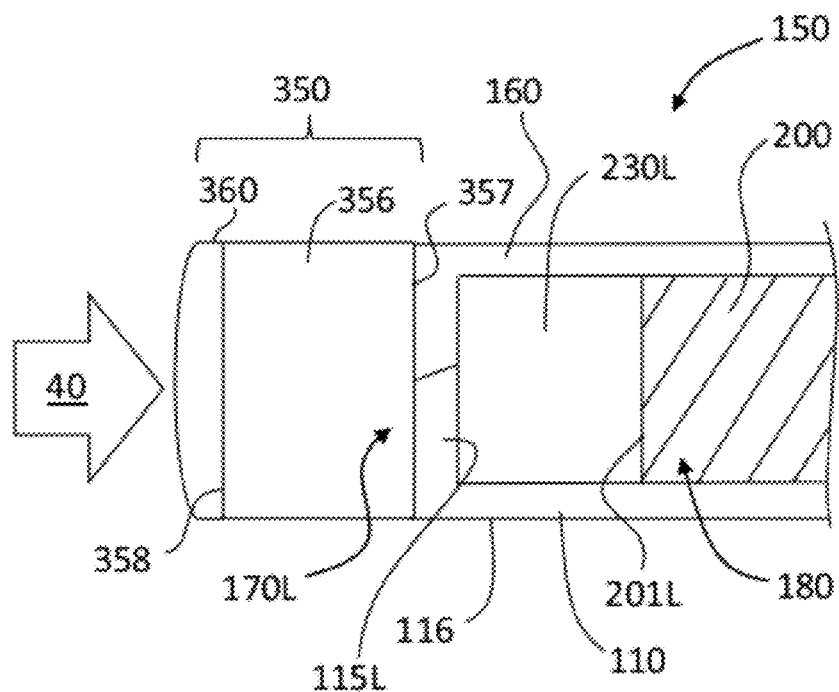
FIG. 18A is a close-up input-end cross-sectional view of an example GIC shell cooling assembly that includes an example passive shield to protect the leading end from power loading from the EUV radiation source.

FIG. 18A is a close-up cross-sectional view of leading end 170L of an example GIC shell cooling assembly 150 that includes an annular shield 350 arranged adjacent to and in contact with the leading end 170L. Shield 350 includes an insulating member 356 with an inner surface 357 adjacent leading end 170L, and an opposite outer surface 358. Insulating member 356 is, in a preferred embodiment, made of a very low thermal conductivity material such as a ceramic (e.g., ceramic foam). An example shield 350 is configured to provide both thermal shield and shielding from erosion due to EUV radiation 40 and other radiation emitted by EUV radiation source 34.

In an example, shield 350 includes a metal layer 360 on outer surface 358 of the insulating member 356. Metal layer 360 comprises a metal having a high melting temperature, and an exemplary metal for metal layer 360 is tungsten or molybdenum. Thus, the thermal load at leading end 170L is dissipated primarily by radiative loss from the metal layer 360 with very little transfer as conduction of heat to input plenum 230L via insulating member 356.

Shield 350 may also serve the additional function of mitigating erosion of reflective inner surface 116 of the GIC shell 160, which in an example includes a gold separation layer covered with a ruthenium layer.

Figure 18B:
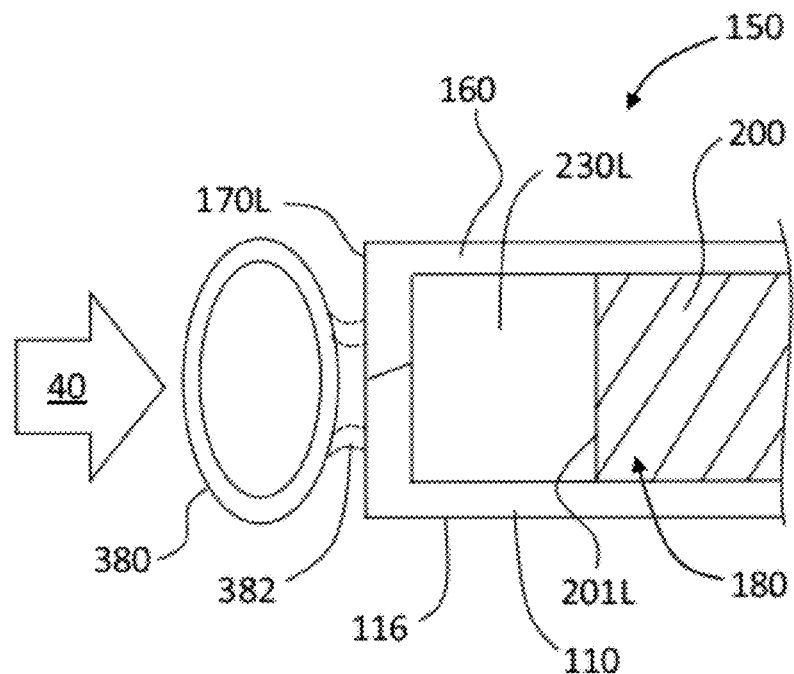
FIG. 18B is similar to FIG. 18A and illustrates an example active heat shield in the form of a cooling ring that runs in front of and around the leading end of the GIC shell cooling assembly thereby protecting the leading end from power loading from the EUV radiation source.

For very high amounts of thermal load on the leading end 170L, the above-described passive shield 350 approach may need to be enhanced. Thus, FIG. 18B is similar to FIG. 18A and illustrates an example active thermal heat shield 350 in the form of a cooled ring 380 that runs around the leading end 170L of the GIC shell cooling assembly 110. Cooled ring 380 may be stood off from the leading end 170L to provide further heat shielding. The stand-off may be accomplished using stand-off elements such as a few attachment clips 382 attached to GIC shell cooling assembly 150. Alternatively, another stand-off structure (not shown) may be used that makes cooling ring 380 free-standing relative to the GIC shell cooling assembly 150. An exemplary material for cooling ring 380 is Nickel, and a suitable coolant 172 is water.

In an example, the outer diameter of the cooling ring 380 is chosen to exactly shadow the leading end 170L of GIC shell cooling assembly 150. A constraint on the shield 350 of the cooling ring 380 is that its temperature must be maintained below 100° C. to keep water coolant 172 from boiling. However, in this case the low operating temperature of the heat shield ameliorates the thermal load at the attachment points. In an example, coolant 172 associated with GIC shell cooling assembly 150 can be shunted from input plenum 230L and returned to output plenum 230T. In another example, coolant 172 is provided to the cooled ring 380 via a coolant line (not shown) that resides in the obscuration provided by a GIC shell support member 120 (e.g., a spider).

The flow rate of water as the coolant 172 required to cool the heat shield 350 of the cooling ring 380 is determined by the thermal load. To limit the temperature rise of the water to $\Delta T$ degrees for a thermal load of P watts, the coolant flow rate must be, $$f(\text{in l/min}) = 6 \times 10^4 \frac{P}{\rho c \Delta T} \quad (2)$$

where $\rho=1000$ kg/m$^3$ and $c=4187$ J/kg-K are the mass density and specific heat of the water. Assuming a maximum heat load of 2 kW and a maximum temperature rise ($\Delta T$) of 30 degrees Kelvin a modest flow rate of ~1 l/min will suffice.

For a Nickel cooling ring inner diameter d=4 mm, the flow velocity is given by, $$v(\text{in m/s}) = 2.1 \times 10^{-5} \frac{f(\text{in l/min})}{d(\text{in m})^2} \quad (3)$$

then for a flow rate of 1 l/min, the coolant fluid flow velocity is 1.3 m/s. The Reynolds number for the flow is given by, $$Re = \frac{vd}{v_K} \quad (4)$$

where $\mu_K = 1 \times 10^{-6}$ (m$^2$/s) is the kinematic viscosity of the water. In this case the Reynolds number is Re=5250, which is comfortably above the threshold of 2320 for the turbulent regime. It is preferred to have turbulent flow to increase the convective heat transfer between the tube walls and the flowing water.

In the turbulent flow regime, the pressure drop in the tube is given by:

$$\frac{dp}{dx}(\text{in bar/m}) = 1 \times 10^{-5} \lambda \frac{\rho v^2}{2d} \quad (5)$$

where $\lambda$ is the friction coefficient between the water and the channel walls. A reasonable value for the friction coefficient in the case of turbulent flow and smooth walls is 0.02. For an example GIC shell 110, the length of the Ni cooling ring 380 is about 1.3 m. The pressure drop through the heat shield 350 according to Eq. (5) is only ·p=0.055 bar.

Thus, the heat shield 350 of the cooling ring 380 is desirable because it requires a modest flow rate of ~1 l/min and a small pressure drop, which means that it is possible to divert a small amount of the water from the GIC shell cooling assembly 150 to the heat shield 350. The heat shield 350 blocks all radiation and particle flux incident on the input edge 112 of the GIC shell 110. Further, because it operates near ambient temperature, there is minimal heat transfer to the GIC shell 110 if attachment hardware is used to support the cooling ring 380 using the GIC shell cooling assembly 150.

EUV Lithography System with GIC SOCOMO

Figure 19:
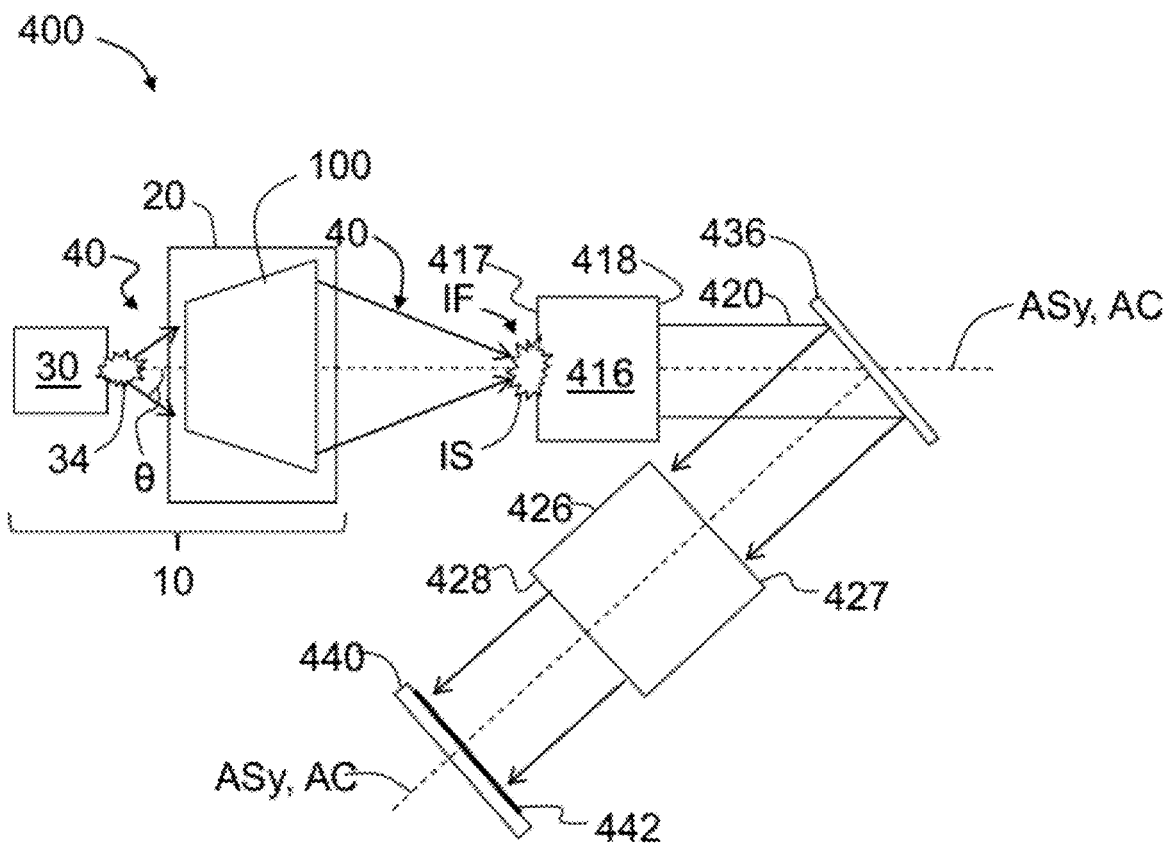
FIG. 19 is a schematic diagram of an example EUV lithography system that incorporates a GIC SOCOMO that includes the GIC shell cooling assembly of the present disclosure.

FIG. 19 is an example EUV lithography system ("system") 400 according to the present invention. Example EUV lithography systems are disclosed, for example, in U.S. Patent Applications No. US2004/0265712A1, US2005/0016679A1 and US2005/0155624A1, which applications are incorporated herein by reference.

System 400 includes a system axis ASy and EUV radiation source 34, such as a hot plasma source, that emits working EUV radiation 40 at $\sim\lambda=13.5$ nm. EUV radiation 40 is generated, for example, by an electrical discharge source (e.g., a discharged produced plasma, or DPP source), or by a laser beam (laser-produced plasma, or LPP source) on a target of Lithium, or Tin. EUV radiation 40 emitted from such a LPP source may be roughly isotropic and, in current DPP sources, may be limited by the discharge electrodes to a source emission angle of about $\theta=70°$ or more from system axis (optical axis) ASy. It is noted that the isotropy of the LPP source will depend on the type of LPP target, e.g., Sn droplets, Sn disc, Sn vapor, etc.

System 400 includes a thermally managed EUV GIC mirror system 20 such as described above. Cooled EUV GIC mirror system 20 is arranged adjacent and downstream of EUV radiation source 34, with collector axis AC lying along system axis ASy. The GIC mirror assembly 100 of EUV GIC mirror system 20 collects EUV radiation 40 from EUV radiation source system 30, and the collected EUV radiation 40 is directed to intermediate focus IF where it forms an intermediate source image IS. An illumination system 416 with an input end 417 and an output end 418 is arranged along system axis ASy and adjacent and downstream of EUV GIC mirror system 20, with the input end 417 adjacent the EUV GIC mirror system 20. Illumination system 416 receives at input end 417 EUV radiation 40 from intermediate source image IS and outputs at output end 418 a substantially uniform EUV radiation beam 420 (i.e., condensed EUV radiation). Where system 400 is a scanning type system, EUV radiation beam 420 is typically formed as a substantially uniform line or arc i.e. ring field of EUV radiation 40 at reflective reticle 436 that scans over the reticle 436.

A projection optical system 426 is arranged along (folded) system axis ASy downstream of illumination system 416. Projection optical system 426 has an input end 427 facing output end 418 of the illumination system 416, and an opposite output end 428. A reflective reticle 436 is arranged adjacent the input end 427 of the projection optical system 426 and a semiconductor wafer 440 is arranged adjacent the output end 428 of the projection optical system 426. Reticle 436 includes a pattern (not shown) to be transferred to semiconductor wafer 440, which includes a photosensitive coating (e.g., photoresist layer) 442. In operation, the uniformized EUV radiation beam 420 irradiates reticle 436 and reflects therefrom, and the pattern thereon is imaged onto photosensitive coating 442 of semiconductor wafer 440 by projection optical system 426. When the system 440 is a scanning system, the reticle image scans over the surface of photosensitive coating 442 to form the pattern over the exposure field. Scanning is typically achieved by moving reticle 436 and semiconductor wafer 440 in synchrony.

Once the reticle pattern is imaged and recorded on semiconductor wafer 440, the patterned semiconductor wafer 440 is then processed using standard photolithographic and semiconductor processing techniques to form integrated circuit (IC) chips.

Note that, in general, the components of system 400 are shown lying along a common folded system axis ASy in FIG. 19 for the sake of illustration. One skilled in the art will understand, for example, that there is often an offset between entrance and exit axes for the various components such as for illumination system 416 and for projection optical system 426. In addition, some systems 400 may include one or more folds to accommodate a desired system architecture, e.g., the orientation of the illuminator relative to GIC mirror system 20.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A grazing incidence collector (GIC) thermal management assembly that employs the flow of a coolant, comprising:
   a GIC mirror shell having a reflective inner surface, an opposite outer surface, and first and second mirror ends;
   a jacket having an inner surface and first and second jacket ends, the jacket and GIC mirror shell having first and second interfaces at the respective first and second mirror and jacket ends to define a fluidly sealed chamber between the inner surface of the jacket and the outer surface of the GIC mirror shell, the sealed chamber having input and output ends that define respective input and output plenums having respective input and output apertures; and
   an open-cell heat transfer (OCHT) material contained within the sealed chamber and that substantially fills the sealed chamber, the OCHT material being thermally connected to the outer surface of the GIC mirror shell and the inner surface of the jacket and serving to support the flow of the coolant therethrough from the input plenum to the output plenum.

2. The GIC thermal management assembly of claim 1, wherein the OCHT material is mechanically connected to the GIC mirror shell and the jacket.

3. The GIC thermal management assembly of claim 1, wherein the coolant is one of a liquid and a gas.

4. The GIC thermal management assembly of claim 1, wherein at least one of the first and second interfaces comprises a compliant feature.

5. The GIC thermal management assembly of claim 4, wherein the compliant feature is configured to be compliant when subject to forces associated with assembling the GIC thermal management assembly but substantially non-compliant when subjected to hydrostatic forces associated with said flow of coolant through the chamber and the OCHT material.

6. The GIC thermal management assembly of claim 5, wherein the compliant feature is formed from the same material as the jacket.

7. The GIC thermal management assembly of claim 5, wherein the compliant feature comprises an epoxy.

8. The GIC thermal management assembly of claim 6, wherein the compliant feature includes a plurality of grooves formed in the jacket at one or both jacket ends.

9. The GIC thermal management assembly of claim 6, wherein the jacket and the GIC mirror shell are either welded together or epoxied together.

10. The GIC thermal management assembly of claim 1, wherein the OCHT material comprises as least one of: a metal foam, one or more springs, and a metal mesh.

11. The GIC thermal management assembly of claim 10, wherein the OCHT material comprises metal foam having a pore density of between 20 pores per inch (PPI) and 100 PPI.

12. The GIC thermal management assembly of claim 10, wherein the OCHT material comprises metal foam, and the metal foam comprises at least one of Al, C, SiC, Cu and Ni.

13. The GIC thermal management assembly of claim 1, wherein the interfaced jacket and GIC mirror shell has a width at respective leading and trailing edges of between 3 mm and 10 mm.

14. The GIC thermal management assembly of claim 1, wherein the OCHT material is thermally contacted to the inner surface of the jacket with intermediate contact layers.

15. The GIC thermal management assembly of claim 14, wherein the intermediate contact layers provide a mechanical bond between the OCHT material, the GIC mirror shell and the jacket.

16. The GIC thermal management assembly of claim 1, wherein the interfaced jacket and GIC mirror shell defines a GIC cooling structure having a leading end and a trailing end, and where the leading end includes a shield.

17. The GIC thermal management assembly of claim 16, wherein the shield comprises a cooled ring.

18. The GIC thermal management assembly of claim 16, wherein the shield includes an inner surface adjacent the leading end and an opposite outer surface, the shield further comprising either tungsten or a molybdenum layer.

19. The GIC thermal management assembly of claim 1, further comprising:
   input and output coolant lines fluidly respectively attached to the input and output plenums.

20. A thermally managed GIC mirror system, comprising:
   the GIC thermal management assembly of claim 19; and
   a coolant supply unit fluidly connected to the input and output coolant lines and configured to provide the fluid of the coolant under pressure to the input plenum via the input coolant line and receive the fluid of the coolant from the output plenum via the output coolant line.

21. The thermally managed GIC mirror system of claim 20, further comprising the input and output plenums being configured to provide coolant to and receive coolant from the OCHT material in an azimuthally symmetric manner.

22. The thermally managed GIC mirror system of claim 21, further comprising the system having a pressure drop along the azimuthal direction of the input and output plenums of less than 2 bar.

23. The thermally managed GIC mirror system of claim 22, wherein the coolant has a flow rate between the input and output plenums of between 5 liters per minute and 60 liters per minute.

24. The thermally managed GIC mirror system according to claim 20, further comprising multiple GIC thermal management assemblies fluidly connected to the coolant supply unit, wherein the GIC mirror shells are configured in a nested configuration.

25. An extreme ultraviolet (EUV) lithography system for illuminating a reflective reticle, comprising:
   a source of EUV radiation;
   the thermally managed GIC mirror system of claim 20 configured to receive the EUV radiation and form collected EUV radiation; and
   an illuminator configured to receive the collected EUV radiation and form condensed EUV radiation for illuminating the reflective reticle.

26. The EUV lithography system of claim 25 for forming a patterned image on a photosensitive semiconductor wafer, further comprising:
   a projection optical system arranged downstream of the reflective reticle and configured to receive reflected EUV radiation from the reflective reticle and form therefrom the patterned image on the photosensitive semiconductor wafer.

* * * * *